US011381255B2

(12) United States Patent
Reynwar et al.

(10) Patent No.: US 11,381,255 B2
(45) Date of Patent: *Jul. 5, 2022

(54) VERTICAL LAYERED FINITE ALPHABET ITERATIVE DECODING

(71) Applicant: Codelucida, Inc., Tucson, AZ (US)

(72) Inventors: Benedict J. Reynwar, Tucson, AZ (US); David Declercq, Tucson, AZ (US); Shiva Kumar Planjery, Tucson, AZ (US)

(73) Assignee: Codelucida, Inc., Tucson, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/735,641

(22) Filed: Jan. 6, 2020

(65) Prior Publication Data
US 2020/0220557 A1  Jul. 9, 2020

Related U.S. Application Data

(63) Continuation of application No. 16/049,724, filed on Jul. 30, 2018, now Pat. No. 10,530,392.
(Continued)

(51) Int. Cl.
*H03M 13/11* (2006.01)
*H03M 13/00* (2006.01)
(Continued)

(52) U.S. Cl.
CPC ........ *H03M 13/118* (2013.01); *H03M 13/114* (2013.01); *H03M 13/116* (2013.01);
(Continued)

(58) Field of Classification Search
CPC ......... H03M 13/1102; H03M 13/1171; H03M 13/1108; H03M 13/116; H03M 13/3707;
(Continued)

(56) References Cited

U.S. PATENT DOCUMENTS 7,519,895 B2   4/2009   Kyung
8,161,345 B2   4/2012   Graef
(Continued)

FOREIGN PATENT DOCUMENTS

EP   2 273 683 A2   1/2011
EP   2 833 553 A1   2/2015

OTHER PUBLICATIONS

U.S. Appl. No. 16,049,724, filed Jul. 30, 2019.
(Continued)

*Primary Examiner* — April Y Blair
*Assistant Examiner* — Sazzad Hossain
(74) *Attorney, Agent, or Firm* — Fish & Richardson P.C.

(57) ABSTRACT

This invention presents a method and apparatus for vertical layered finite alphabet iterative decoding of low-density parity-check codes (LDPC) which operate on parity check matrices that consist of blocks of sub-matrices. The iterative decoding involves passing messages between variable nodes and check nodes of the Tanner graph that associated with one or more sub-matrices constitute decoding blocks, and the messages belong to a finite alphabet. Various embodiments for the method and apparatus of the invention are presented that can achieve very high throughputs with low hardware resource usage and power.

14 Claims, 20 Drawing Sheets

Related U.S. Application Data

(60) Provisional application No. 62/539,476, filed on Jul. 31, 2017.

(51) Int. Cl.
  *H03M 13/37* (2006.01)
  *H04L 1/00* (2006.01)
  *H03M 13/29* (2006.01)

(52) U.S. Cl.
  CPC .... *H03M 13/1117* (2013.01); *H03M 13/6577* (2013.01); *H03M 13/1102* (2013.01); *H03M 13/1108* (2013.01); *H03M 13/1111* (2013.01); *H03M 13/1171* (2013.01); *H03M 13/2975* (2013.01); *H03M 13/3707* (2013.01); *H03M 13/3746* (2013.01); *H04L 1/005* (2013.01); *H04L 1/0054* (2013.01)

(58) Field of Classification Search
  CPC ......... H03M 13/3746; H03M 13/2975; H03M 13/118; H03M 13/1117; H03M 13/114; H03M 13/6577; H03M 13/1111; H04L 1/005; H04L 1/0054
  See application file for complete search history.

(56) References Cited

U.S. PATENT DOCUMENTS

| | | | |
|---|---|---|---|
| 8,458,556 B2 | 6/2013 | Planjery et al. | |
| 8,510,624 B2 | 8/2013 | Kim et al. | |
| 8,918,694 B2 | 12/2014 | Marero et al. | |
| 9,015,550 B2 | 4/2015 | Wang et al. | |
| 9,048,867 B2 | 6/2015 | Liu et al. | |
| 9,331,716 B2 | 5/2016 | Panteleev et al. | |
| 9,459,956 B2 | 10/2016 | Hubris et al. | |
| 9,553,608 B2 * | 1/2017 | Li | G06F 11/1068 |
| 10,110,249 B2 | 10/2018 | Zhang et al. | |
| 10,367,526 B2 | 7/2019 | Liu et al. | |
| 10,530,392 B2 * | 1/2020 | Reynwar | H03M 13/6577 |
| 10,594,339 B2 | 3/2020 | Panteleev et al. | |
| 10,651,872 B2 | 5/2020 | Savin et al. | |
| 10,778,251 B2 | 9/2020 | Declercq et al. | |
| 2003/0126551 A1 | 7/2003 | Mantha et al. | |
| 2005/0149842 A1 | 6/2005 | Kyung et al. | |
| 2005/0229090 A1 | 10/2005 | Shen et al. | |
| 2006/0036926 A1 | 2/2006 | Hocevar | |
| 2007/0283219 A1 * | 12/2007 | Park | H03M 13/6544 714/758 |
| 2014/0223254 A1 | 8/2014 | Pisek | |
| 2014/0229792 A1 * | 8/2014 | Varnica | H03M 13/1108 714/759 |
| 2017/0141796 A1 | 5/2017 | Koike-Akino et al. | |
| 2017/0244515 A1 * | 8/2017 | Razzetti | H04B 10/616 |
| 2018/0062666 A1 * | 3/2018 | Zhang | H03M 13/6502 |
| 2020/0044667 A1 | 2/2020 | Declercq et al. | |
| 2021/0391872 A1 | 12/2021 | Declercq et al. | |

OTHER PUBLICATIONS

Cai et al., "Low-Complexity Finite Alphabet Iterative Decoders for LDPC Codes," IEEE International Symposium on Circuits and Systems, May 2013, 1332-1335.

Cui et al., "Reduced-complexity column-layered decoding and implementation for LDPC codes," IET Commun, 2011, 5(15): 2177-2186.

Declercq et al., "An Imprecise Stopping Criterion Based on In-Between Layers Partial Syndromes," IEEE Communications Letters, Jan. 2018, 22(1): 13-16.

Declercq et al., "Approaching Maximum Likelihood decoding of finite length LDPC codes via FAID diversity," IEEE Information Theory Workshop, 2012, 487-491.

Declercq et al., "Finite Alphabet Iterative Decoders—Part II: Towards Guaranteed Error Correction of LDPC Codes via Iterative Decoder Diversity," IEEE Transactions on Communications, Oct. 2013, 61(10): 4046-4057.

Hocevar, "A Reduced Complexity Decoder Architecture via Layered Decoding of LDPC Codes," IEEE SIPS, 2004, 107-112.

Nguyen-Ly et al., "Analysis and Design of Cost-Effective High-Throughput LDPC Decoders," IEEE Transactions on Very Large Scale Integration (VLSI) Systems, Mar. 2018, 26(3): 508-521.

Planjery et al., "Finite alphabet iterative decoders—Part I: Decoding Beyond Belief Propagation on the Binary Symmetric Channel," IEEE Transactions on Communications, Oct. 2013, 61(10): 4033-4045.

Planjery et al., "Finite alphabet iterative decoders LDPC codes surpassing floating-point iterative decoders," Electronic Letters, Aug. 2011, 47(16): 2 pages.

Radosavljevic et al., "Optimized Message Passing Schedules for LDPC Decoding," IEEE Signals, Systems and Computers, Oct. 2005, 591-595.

Sharon et al., "Efficient Serial Message-Passing Schedules for LDPC decoding," IEEE Transactions on Information Theory, Nov. 2007, 53(11): 4076-4091.

Vasic and Milenkovic, "Combinatorial Constructions of Low-Density Parity-Check Codes for Iterative Decoding," IEEE Transactions on Information Theory, Jun. 2004, 50(6): 1156-1176.

Zhang and Fossorier, "Transactions Letters: Shuffled Iterative Decoding," IEEE Transactions on Communications, Feb. 2005, 53(2): 209-213.

International Search Report and Written Opinion of the International Searching Authority, PCT Application No. PCT/US2018/044691, dated Oct. 30, 2018, 12 pp.

Li, Rongchun et al: "A multi-standard efficient column-layered LDPC decoder for Software Defined Radio on GPUs", Proc., IEEE 14th Workshop on Signal Processing Advances In Wireless Communications, SPAWC, Jun. 16, 2013 (Jun. 16, 2013), pp. 724-728, XP032490422, ISSN: 1948-3244, DOI: 10.1109/SPAWC.2013.6612145 [retrieved on Sep. 25, 2013].

Kanchetla, Vijaya Kumar et al.: "Multi-standard high-throughput and low-power quasi-cyclic low density parity check decoder for worldwide interoperability for microwave access and wireless fidelity standards", IET Circuits Devices And Systems, The Institution Of Engineering And Technology, GB, vol. 10, No. 2,Mar. 1, 2016 (Mar. 1, 2016), pp. 111-120, XP006076546, ISSN: 1751-858X, DOI: 10.1049/IET-CDS.2014.0347.

Zhongfeng, Wang et al.: "VLSI Design for Low-Density Parity-Check Code Decoding", IEEE Circuits And Systems Magazine, IEEE Service Center, New York, NY, US, vol. 11, No. 1,Jan. 1, 2011 (Jan. 1, 2011), pp. 52-69, XP011348868, ISSN: 1531-636X, DOI: 10.1109/MCAS.2010.939785.

Cai, Fang et al.: "Finite Alphabet Iterative Decoders for LDPC Codes: Optimization, Architecture and Analysis", IEEE Transactions On Circuits And Systems I: Regular Papers, IEEE, US, vol. 61, No. 5,May 1, 2014 (May 1, 2014), pp. 1366-1375, XP011546491, ISSN: 1549-8328, DOI: 10.1109/TCSI.2014.2309896 [retrieved on Apr. 24, 2014].

Extended European Search Report, dated Jul. 6, 2020, corresponding to European Application No. EP 18841488.2, 19 pages.

Angarita et al. "Reduced-complexity min-sum algorithm for decoding IDPC codes with low error-floor," IEEE Transactions on Circuits and Systems—I: Regular Papers, IEEE, Jul. 1, 2014, 61(7):2150-2158.

Catala-Perez et al. "Second minimum approximation for min-sum decoders suitable for high-rate IDPC codes," Circuits, Systems and Signal Processing, Apr. 5, 2019, 38(11):5068-5080.

Extended European Search Report in European Appln No. 21167522.8, dated Aug. 9, 2021, 15 pages.

Zhang et al., "Efficient column-layered decoders for single block-row quasi-cyclic LDPC codes," IEEE International Symposium on Circuits and Systems, Jun. 1, 2014, 413-416.

\* cited by examiner

■ LxL Non-null Circulant
□ LxL Null Circulant

VERTICAL LAYERED FINITE ALPHABET ITERATIVE DECODING

CROSS-REFERENCE TO RELATED APPLICATIONS

This application claims priority to U.S. patent application Ser. No. 16/049,724, filed Jul. 30, 2018, which claims the benefit of Provisional Application No. 62/539,476, filed Jul. 31, 2017, the entire contents of each of which are hereby incorporated by reference as if fully set forth herein.

STATEMENT REGARDING FEDERALLY SPONSORED RESEARCH

This invention was made partially with the support of the National Science Foundation Award IIP-1534760. The United States Government has certain rights in this invention.

FIELD OF INVENTION

The present invention generally relates to error correction coding for information transmission, storage and processing systems, such as wired and wireless communications systems, flash memories and other memories, mass data storage systems, and storage drive systems. More particularly, it relates to iterative message-passing of block codes such as low-density parity-check (LDPC) codes, and more specifically to LDPC codes with parity check matrices consisting of blocks of sub-matrices which includes the class of quasi-cyclic LDPC codes where the sub-matrices are circulant matrices.

BACKGROUND

Error correcting codes play a vital role in communication, computer, and storage systems by ensuring the integrity of data. This invention pertains to the class of error correcting codes known as low-density parity-check (LDPC) codes and their iterative message-passing decoding algorithms. LDPC codes have gained prominence due to their ability to approach the information-theoretic channel capacity in the limit of infinite codeword length. They are standardized in a number of applications including wireless communications, satellite communications, deep-space communications, optical communications, as well as in storage systems such as solid state drives and hard disk drives. More recently, they have been gaining prominence for NAND flash memory applications due to the increasing densities of flash memories. All these applications are considered within the scope of use of this present invention.

A binary LDPC code is defined by a parity-check matrix (PCM) H that has N columns and M rows along with its corresponding Tanner graph G. The Tanner graph G is a bipartite graph consisting of a set of variable nodes $V=\{v_1, v_2, \ldots, v_N\}$ of cardinality N, and a set of check nodes $C=\{c_1, c_2, \ldots, c_M\}$ of cardinality M, that are connected by edges where an edge exists between nodes $c_i$ and $v_j$ if the matrix element in the parity-check matrix is equal to $H_{i,j}=1$. The weight of a column (or row) in H is the number of non-zero values iti contains. The degree of a variable node (or check node) is the number of its neighbors which is equal to the weight of its corresponding column (or row) in H. Therefore, the degree of a variable node $v_j$ will be equal to the weight of the j-th column of the parity-check matrikx and the degree of a check node $c_i$ will be equal to the weight of the i-th row. An LDPC code is said to have fixed column weight $d_v$ if every column in H has weight $d_v$, and variable column weight if there are at least two columns in H that have different weights. Similarly, an LDPC code is said to have fixed row weight $d_c$ if every row in H has weight $d_c$. An example of a parity-check matrix is given in Eq. 1 below.

$$H = \begin{pmatrix}
1 & 0 & 0 & 0 & 0 & 1 & 0 & 0 & 0 & 0 & 1 & 0 & 0 & 0 & 0 & 1 & 0 & 0 & 0 & 0 & 1 & 0 & 0 & 0 & 0 \\
0 & 1 & 0 & 0 & 0 & 0 & 1 & 0 & 0 & 0 & 0 & 1 & 0 & 0 & 0 & 0 & 1 & 0 & 0 & 0 & 0 & 1 & 0 & 0 & 0 \\
0 & 0 & 1 & 0 & 0 & 0 & 0 & 1 & 0 & 0 & 0 & 0 & 1 & 0 & 0 & 0 & 0 & 1 & 0 & 0 & 0 & 0 & 1 & 0 & 0 \\
0 & 0 & 0 & 1 & 0 & 0 & 0 & 0 & 1 & 0 & 0 & 0 & 0 & 1 & 0 & 0 & 0 & 0 & 1 & 0 & 0 & 0 & 0 & 1 & 0 \\
0 & 0 & 0 & 0 & 1 & 0 & 0 & 0 & 0 & 1 & 0 & 0 & 0 & 0 & 1 & 0 & 0 & 0 & 0 & 1 & 0 & 0 & 0 & 0 & 1 \\
1 & 0 & 0 & 0 & 0 & 0 & 0 & 0 & 1 & 0 & 0 & 0 & 1 & 0 & 0 & 1 & 0 & 0 & 0 & 1 & 0 & 0 & 0 & 0 & 0 \\
0 & 1 & 0 & 0 & 1 & 0 & 0 & 0 & 0 & 0 & 0 & 0 & 1 & 0 & 0 & 1 & 0 & 0 & 0 & 1 & 0 & 0 & 0 & 0 & 0 \\
0 & 0 & 1 & 0 & 0 & 0 & 1 & 0 & 0 & 0 & 1 & 0 & 0 & 0 & 0 & 0 & 0 & 0 & 1 & 0 & 0 & 0 & 0 & 1 & 0 \\
0 & 0 & 0 & 1 & 0 & 0 & 0 & 1 & 0 & 0 & 0 & 1 & 0 & 0 & 0 & 1 & 0 & 0 & 0 & 0 & 0 & 0 & 0 & 0 & 1 \\
0 & 0 & 0 & 0 & 1 & 0 & 0 & 0 & 1 & 0 & 0 & 0 & 1 & 0 & 0 & 0 & 1 & 0 & 0 & 0 & 1 & 0 & 0 & 0 & 0 \\
1 & 0 & 0 & 0 & 0 & 0 & 0 & 0 & 1 & 0 & 0 & 1 & 0 & 0 & 0 & 0 & 0 & 0 & 1 & 0 & 0 & 1 & 0 & 0 & 0 \\
0 & 1 & 0 & 0 & 0 & 0 & 0 & 0 & 0 & 1 & 0 & 0 & 1 & 0 & 0 & 1 & 0 & 0 & 0 & 0 & 0 & 0 & 0 & 1 & 0 \\
0 & 0 & 1 & 0 & 0 & 1 & 0 & 0 & 0 & 0 & 0 & 0 & 0 & 1 & 0 & 0 & 1 & 0 & 0 & 0 & 0 & 0 & 0 & 0 & 1 \\
0 & 0 & 0 & 1 & 0 & 0 & 1 & 0 & 0 & 0 & 0 & 0 & 0 & 0 & 1 & 0 & 0 & 1 & 0 & 0 & 1 & 0 & 0 & 0 & 0 \\
0 & 0 & 0 & 0 & 1 & 0 & 0 & 1 & 0 & 0 & 1 & 0 & 0 & 0 & 0 & 0 & 0 & 0 & 1 & 0 & 0 & 1 & 0 & 0 & 0 \\
\end{pmatrix} \quad (1)$$

A codeword of an LDPC code, $x=(x_1, x_2, \ldots, x_N)$, is sent over a channel that could either be a communication channel or a data storage medium that stores the codeword. A value $x_i$ in the codeword is the binary value associated with the variable node $v_i$ in G. The channel vector $y=(y_1, y_2, \ldots, y_N)$, is the vector that is computed based on the received vector r from the channel which may be different from x due to errors introduced by the channel. For example, in the specific case of the Binary Symmetric Channel (BSC), r=x+e, where + denotes an exclusive OR (XOR) operation, and the elements of the vector e represent errors introduced by flipping the codeword bits in x with probability $\alpha$. The values $y_i \in y$ referred to as channel values in this disclosure belong to a channel output alphabet y. The vector y is input to the iterative decoder in order to recover x.

The present invention is applicable to the BSC and also for more general classes of channels which have larger channel output alphabets like for example the quantized additive white Gaussian noise (AWGN) channel. For the case of BSC which has only two possible channel outputs, y may be defined as $y=\{\pm 1\}$ where by convention, +1 corresponds to the received bit value of 0, and −1 corresponds to a received bit value of 1. For the case of larger channel output alphabets, y can be defined as $y=\{\pm 1, \pm 2, \ldots q\}$, if the number of possible channel outputs is even and equal to 2q or y={0, ±1, ±2, . . . q} if the number of possible channel outputs is odd and equal 2q+1.

In a more general setting, any channel output can be defined as y={±Y$_1$, ±Y$_2$, . . . ±Y$_q$} for even cardinality and y={0, ±Y$_1$, ±Y$_2$, Y$_q$} for odd cardinality, for which the present invention may also be used. For this disclosure, if the elements of the channel vector y can only take two possible values, then the decoding is referred to as hard-decision decoding and y is referred to as hard-decision input. If the elements in vector y can take more than two possible values, then the decoding is referred to as soft-decision decoding and the input is referred to as soft-decision input. For soft decision decoding, y is said to be a n$_q$-bit soft-decision input, with n$_q$=⌈log$_2$(2q)⌉ in case of even cardinality, and n$_q$=⌈log$_2$(2q+1)⌉ in case of odd cardinality. ⌈x⌉ is the smallest integer larger than x.

The embodiments of the present invention can be illustrated through the use of a Tanner graph G where the decoding involves iteratively passing messages along the edges of the graph. This type of decoding is referred to as message-passing decoding of an LDPC code. FIG. 1 shows an example of a Tanner graph for the LDPC code of Eq.1, where the circles represent the variable nodes and squares represent the check nodes. The decoder is initialized by inputting the channel vector y and then messages are iteratively passed between the variable nodes and check nodes along the edges of the graph G. The messages get updated each time they arrive at a node in a manner such that the outgoing message on a particular edge is computed based on all of the incoming messages of that node, excluding the incoming message of that particular edge. An iteration of decoding is performed when all nodes in the graph have been processed at least one time in a particular order of processing typically referred to as scheduling. At the end of each iteration and also during the processing of one iteration of decoding, estimates of the bit values $\hat{x}_i$ are computed for all variable nodes $v_i$ based on the messages they receive from their neighboring check nodes, and the channel values $y_i$. The hard-decision estimates of bit values are computed using a decision function Ψ and used to check whether the decoder has converged to a codeword by sending them to the validator which computes the syndrome of the vector $\hat{x}$. The syndrome is defined as $$H\hat{x}^T = 0 (\mod 2). \quad (2)$$

where $x^T$ denotes the transposition of vector x. The elements of the syndrome vector are referred to as syndrome bits. The validator checks whether at a given check node, the corresponding hard-decision estimates of their neighboring variable nodes form an even parity, and such a check node is said to be satisfied else it is unsatisfied. If every check node is satisfied, then the syndrome is zero and the decoder has converged to a codeword. The iterative process continues until the decoder converges to a codeword or has reached a maximum number of iterations. A decoder is said to have failed if it does not converge to a codeword.

The embodiments of the present invention are further related to a class of iterative message-passing decoders called finite alphabet iterative decoders (FAIDs). In these decoders, the messages belong to a finite alphabet $\mathcal{M}$ which consists of a finite—typically small—number of levels. For the specific illustrative case where $\mathcal{M}$ has odd cardinality, the message alphabet is denoted $\mathcal{M}$ ={0, ±L$_i$:1≤i≤s} where L$_i$∈ℝ$^+$ and L$_i$>L$_j$ for any i>j.

The variable node update function for a variable node of degree d$_v$ in a FAID is a pre-defined map $\Phi_v$:y× $\{\mathcal{M}\}^{d_v-1}$→$\mathcal{M}$ which in this disclosure is referred to as variable node (VN) map, or VN map that computes the outgoing message on a particular edge as a function of the d$_v$-1 incoming messages at the node, excluding the incoming message on that particular edge, and the channel value y$_i$. The variable node update function can be designed to improve the error-correction capability of the decoder. An example of a map $\Phi_v$ for a variable node of degree d$_v$=3 is provided in Table 1 below. In this example, the VN Map has 7 possible levels, i.e. s=3, and we show only the VN Map corresponding to y=−Y, so that the table entries are $\Phi_v$ (−Y, m$_1$, m$_2$).

TABLE 1

| m$_1$/m$_2$ | −L$_3$ | −L$_2$ | −L$_1$ | 0 | +L$_1$ | +L$_2$ | +L$_3$ |
| --- | --- | --- | --- | --- | --- | --- | --- |
| −L$_3$ | −L$_3$ | −L$_3$ | −L$_3$ | −L$_3$ | −L$_3$ | −L$_3$ | −L$_1$ |
| −L$_2$ | −L$_3$ | −L$_3$ | −L$_3$ | −L$_3$ | −L$_2$ | −L$_1$ | +L$_1$ |
| −L$_1$ | −L$_3$ | −L$_3$ | −L$_2$ | −L$_2$ | −L$_1$ | −L$_1$ | +L$_1$ |
| 0 | −L$_3$ | −L$_3$ | −L$_2$ | −L$_1$ | 0 | 0 | +L$_1$ |
| +L$_1$ | −L$_3$ | −L$_2$ | −L$_1$ | 0 | 0 | +L$_1$ | +L$_2$ |
| +L$_2$ | −L$_3$ | −L$_1$ | −L$_1$ | 0 | +L$_1$ | +L$_1$ | +L$_3$ |
| +L$_3$ | −L$_1$ | +L$_1$ | +L$_1$ | +L$_1$ | +L$_2$ | +L$_3$ | +L$_3$ |

Note that the VN map for the channel value y=+Y can be deduced from the one with channel value y=−Y by symmetry:

$$\Phi_v(Y, m_1, m_2) = -\Phi_v(-Y, -m_1, -m_2) m_1 \in \mathcal{M}\ m_2 \in \mathcal{M} \quad (3)$$

The check node update function $\Phi_c$ used in FAID is similar to the function used in the min-sum decoder which is typically used in the state-of-the-art. Let the edges incident to a check node of degree d$_c$ be labeled from 1 to d$_c$, referred to as edge indices, and let m$_1$, . . . , m$_{d_c-1}$ denote the incoming messages to a check node with degree d$_c$ such that m$_k$ denotes the incoming message corresponding to the k-th edge index. Then, in order to compute the outgoing message from the check node corresponding to the d$_c$-th edge index, $\Phi_c$ is given by $$\Phi_c(m_1, \ldots, m_{d_c-1}) = \left(\prod_{j=1}^{d_c-1} \text{sgn}(m_j)\right) \min_{1 \le j \le d_c-1} (|m_j|). \quad (4)$$

It is worth noting that the main difference between FAID and state-of-the-art min-sum decoders (and its variants) is in the definition of $\Phi_v$. It was shown that FAID can outperform traditional message-passing decoders in the error-floor region for the BSC and numerical results were presented for codes with variable node of degree d$_v$=3. In addition, it was shown that multiple FAIDs with different VN maps can be employed to further improve the performance at the cost of higher complexity Preferred embodiments of the present invention specifically focus on LDPC codes whose parity-check matrices are composed of blocks of sub-matrices, though the present invention is not limited to such codes. In these preferred embodiments, the parity check matrix H is organized in blocks, or sub-matrices, as defined in Eq. 5, $$H = \begin{pmatrix} H_{1,1} & H_{1,2} & \ldots & H_{1,N_b} \\ H_{2,1} & H_{2,2} & \ldots & H_{2,N} \\ \vdots & \vdots & \vdots & \vdots \\ H_{M_b,1} & H_{M_b,2} & \ldots & H_{M_b,N_b} \end{pmatrix} \quad (5)$$

wherein the the sub-matrices H$_{i,j}$, 1≤i≤M$_b$, 1≤j≤N$_b$ have equal vertical dimensions for any fixed j, and have equal horizontal dimensions for every fixed i.

A column block is referred to as an entire column of sub-matrix blocks of the parity-check matrix, and the column block index j refers to the j-th column block that consists of the sub-matrices {H$_{i,j}$, 1≤i≤M$_b$}. Similarly a row block is referred to as an entire row of sub-matrix blocks of the parity-check matrix, and the row block index i refers to the i-th row block that consists of the sub-matrices {$H_{i,j}$, $1 \leq j \leq N_b$}. The dimensions for the sub-matrices can be arbitrary, and for the case when the sub-matrices $H_{i,j}$ are L×L square matrices, L can be arbitrary. In preferred embodiments of this disclosure, the sub-matrices $H_{i,j}$ are L×L square matrices, and can be circulant permutation matrices (CPM), all-zero matrices, or sums of circulant permutation matrices. This type of sub-matrix is commonly used in the state-of-the-art, and have the particularity that they can be defined by their first row/column together with a procedure to generate the remaining rows/columns. In circulant permutation matrices, each row/column can be obtained by a circular (cyclic) shift of another row/column. The LDPC codes for which the parity-check matrices are organized in blocks that are circulant permutation matrices, are referred to as quasi-cyclic LDPC (QC-LDPC) codes.

A CPM is defined as the power of a primitive element of a cyclic group. The primitive element is defined, for example, by the L×L matrix, P, shown in Eq. 6 for L=8.

$$P = \begin{pmatrix} 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{pmatrix} \quad (6)$$

As a result, a CPM $P^k$, with $k \in \{0, \ldots, L-1\}$ has the form of the identity matrix, shifted k positions to the left. Said otherwise, the row-index of the nonzero value of the first column of $P^k$, is k+1. The index k will be referred to in this disclosure as the CPM shift value. An example of a parity-check matrix for L=5, $M_b$=3 and $N_b$=5 composed of powers of CPMs is given in Eq. 7.

$$H = \begin{pmatrix} 1 & 0 & 0 & 0 & 0 & 1 & 0 & 0 & 0 & 0 & 1 & 0 & 0 & 0 & 0 & 1 & 0 & 0 & 0 & 0 & 1 & 0 & 0 & 0 & 0 \\ 0 & 1 & 0 & 0 & 0 & 0 & 1 & 0 & 0 & 0 & 0 & 1 & 0 & 0 & 0 & 0 & 1 & 0 & 0 & 0 & 0 & 1 & 0 & 0 & 0 \\ 0 & 0 & 1 & 0 & 0 & 0 & 0 & 1 & 0 & 0 & 0 & 0 & 1 & 0 & 0 & 0 & 0 & 1 & 0 & 0 & 0 & 0 & 1 & 0 & 0 \\ 0 & 0 & 0 & 1 & 0 & 0 & 0 & 0 & 1 & 0 & 0 & 0 & 0 & 1 & 0 & 0 & 0 & 0 & 1 & 0 & 0 & 0 & 0 & 1 & 0 \\ 0 & 0 & 0 & 0 & 1 & 0 & 0 & 0 & 0 & 1 & 0 & 0 & 0 & 0 & 1 & 0 & 0 & 0 & 0 & 1 & 0 & 0 & 0 & 0 & 1 \\ 1 & 0 & 0 & 0 & 0 & 0 & 0 & 0 & 0 & 1 & 0 & 0 & 0 & 1 & 0 & 0 & 0 & 1 & 0 & 0 & 0 & 1 & 0 & 0 & 0 \\ 0 & 1 & 0 & 0 & 0 & 1 & 0 & 0 & 0 & 0 & 0 & 0 & 0 & 0 & 1 & 0 & 0 & 0 & 1 & 0 & 0 & 0 & 1 & 0 & 0 \\ 0 & 0 & 1 & 0 & 0 & 0 & 1 & 0 & 0 & 0 & 1 & 0 & 0 & 0 & 0 & 0 & 0 & 0 & 0 & 1 & 0 & 0 & 0 & 1 & 0 \\ 0 & 0 & 0 & 1 & 0 & 0 & 0 & 1 & 0 & 0 & 0 & 1 & 0 & 0 & 0 & 1 & 0 & 0 & 0 & 0 & 0 & 0 & 0 & 0 & 1 \\ 0 & 0 & 0 & 0 & 1 & 0 & 0 & 0 & 1 & 0 & 0 & 0 & 1 & 0 & 0 & 0 & 1 & 0 & 0 & 0 & 1 & 0 & 0 & 0 & 0 \\ 1 & 0 & 0 & 0 & 0 & 0 & 0 & 1 & 0 & 0 & 0 & 1 & 0 & 0 & 0 & 0 & 0 & 0 & 0 & 1 & 0 & 0 & 1 & 0 & 0 \\ 0 & 1 & 0 & 0 & 0 & 0 & 0 & 0 & 0 & 1 & 0 & 0 & 1 & 0 & 0 & 1 & 0 & 0 & 0 & 0 & 0 & 0 & 0 & 1 & 0 \\ 0 & 0 & 1 & 0 & 0 & 1 & 0 & 0 & 0 & 0 & 0 & 0 & 0 & 1 & 0 & 0 & 1 & 0 & 0 & 0 & 0 & 0 & 0 & 0 & 1 \\ 0 & 0 & 0 & 1 & 0 & 0 & 1 & 0 & 0 & 0 & 0 & 0 & 0 & 0 & 1 & 0 & 0 & 1 & 0 & 0 & 1 & 0 & 0 & 0 & 0 \\ 0 & 0 & 0 & 0 & 1 & 0 & 0 & 1 & 0 & 0 & 1 & 0 & 0 & 0 & 0 & 0 & 0 & 0 & 1 & 0 & 0 & 1 & 0 & 0 & 0 \end{pmatrix} \quad (7)$$

In this disclosure, a sub-matrix $H_{i,j}$ is referred to as a null sub-matrix if $H_{i,j}$ is an all-zero sub-matrix, else it is a non-null sub-matrix, and the number of non-null sub-matrices contained in a column block is referred to as column block degree. An example of a parity-check matrix containing null and non-null sub-matrices is shown in Eq. 8.

$$H = \begin{pmatrix} 1 & 0 & 0 & 0 & 0 & 1 & 0 & 0 & 0 & 0 & 1 & 0 & 0 & 0 & 0 & 0 & 0 & 0 & 0 & 0 & 0 & 0 & 0 & 0 & 0 \\ 0 & 1 & 0 & 0 & 0 & 0 & 1 & 0 & 0 & 0 & 0 & 1 & 0 & 0 & 0 & 0 & 0 & 0 & 0 & 0 & 0 & 0 & 0 & 0 & 0 \\ 0 & 0 & 1 & 0 & 0 & 0 & 0 & 1 & 0 & 0 & 0 & 0 & 1 & 0 & 0 & 0 & 0 & 0 & 0 & 0 & 0 & 0 & 0 & 0 & 0 \\ 0 & 0 & 0 & 1 & 0 & 0 & 0 & 0 & 1 & 0 & 0 & 0 & 0 & 1 & 0 & 0 & 0 & 0 & 0 & 0 & 0 & 0 & 0 & 0 & 0 \\ 0 & 0 & 0 & 0 & 1 & 0 & 0 & 0 & 0 & 1 & 0 & 0 & 0 & 0 & 1 & 0 & 0 & 0 & 0 & 0 & 0 & 0 & 0 & 0 & 0 \\ 1 & 0 & 0 & 0 & 0 & 0 & 0 & 0 & 0 & 1 & 0 & 0 & 0 & 0 & 0 & 0 & 0 & 1 & 0 & 0 & 0 & 1 & 0 & 0 & 0 \\ 0 & 1 & 0 & 0 & 0 & 1 & 0 & 0 & 0 & 0 & 0 & 0 & 0 & 0 & 0 & 0 & 0 & 0 & 1 & 0 & 0 & 0 & 1 & 0 & 0 \\ 0 & 0 & 1 & 0 & 0 & 0 & 1 & 0 & 0 & 0 & 0 & 0 & 0 & 0 & 0 & 0 & 0 & 0 & 0 & 1 & 0 & 0 & 0 & 1 & 0 \\ 0 & 0 & 0 & 1 & 0 & 0 & 0 & 1 & 0 & 0 & 0 & 0 & 0 & 0 & 0 & 1 & 0 & 0 & 0 & 0 & 0 & 0 & 0 & 0 & 1 \\ 0 & 0 & 0 & 0 & 1 & 0 & 0 & 0 & 1 & 0 & 0 & 0 & 0 & 0 & 0 & 0 & 1 & 0 & 0 & 0 & 1 & 0 & 0 & 0 & 0 \\ 0 & 0 & 0 & 0 & 0 & 0 & 0 & 1 & 0 & 0 & 0 & 1 & 0 & 0 & 0 & 0 & 0 & 0 & 0 & 1 & 0 & 0 & 1 & 0 & 0 \\ 0 & 0 & 0 & 0 & 0 & 0 & 0 & 0 & 0 & 1 & 0 & 0 & 1 & 0 & 0 & 1 & 0 & 0 & 0 & 0 & 0 & 0 & 0 & 1 & 0 \\ 0 & 0 & 0 & 0 & 0 & 1 & 0 & 0 & 0 & 0 & 0 & 0 & 0 & 1 & 0 & 0 & 1 & 0 & 0 & 0 & 0 & 0 & 0 & 0 & 1 \\ 0 & 0 & 0 & 0 & 0 & 0 & 1 & 0 & 0 & 0 & 0 & 0 & 0 & 0 & 1 & 0 & 0 & 1 & 0 & 0 & 1 & 0 & 0 & 0 & 0 \\ 0 & 0 & 0 & 0 & 0 & 0 & 0 & 1 & 0 & 0 & 1 & 0 & 0 & 0 & 0 & 0 & 0 & 0 & 1 & 0 & 0 & 1 & 0 & 0 & 0 \end{pmatrix} \quad (8)$$

Also relevant to this disclosure is the concept of layered decoding that is used to improve the decoder convergence speed while still maintaining a low hardware complexity. Layered LDPC decoding schemes effectively improve the convergence by reducing the required number of decoding iterations needed to reach successful decoding. A layered decoder produces messages from a subset of the check nodes to a subset of the variable nodes, followed by producing messages from a subset of the variable nodes to a subset of the check nodes. A layered decoder has a low resource utilization and requires low average number of iterations. For QC-LDPC codes, a row-layer is typically composed of L consecutive rows of the PCM, defined by a set of circulant permutation matrices. For example, the i-th row block in Eq. 5 defines the i-th row-layer. Similarly, a column-layer is composed of L consecutive columns of the PCM. For example, the j-th column block in Eq. 5 defines the j-th column-layer.

There are two main classes of layered decoding: row- or horizontal-layered decoding and column- or vertical-layered decoding. In horizontal-layered decoding, the parity check matrix of the LDPC code is subdivided into plurality of row layers, and the message updating is performed row layer by row layer. In vertical-layered decoding, the parity check matrix is partitioned into multiple column layers, and the message computation is performed column layer by column layer.

The concept of layers can be further extended to the concept of generalized row layer, for which the definition is:
A generalized row layer is defined as the concatenation of two or more row layers of the base matrix, such that in each column block of the generalized row layer, there is at most one non-null sub-matrix while its other blocks are null sub-matrices.
A full generalized row layer has further the property that each column block of the generalized row layer contains exactly one non-null sub-matrix.

This definition ensures that for a QC-LDPC code with maximum column degree $d_v$, the PCM can be structured with at least $d_v$ generalized row layers. For simplicity, and without loss of generality, we will assume in this disclosure that the number of generalized row layers is often equal to the maximum column degree $d_v$. In a PCM that has a structure consisting of generalized row layers, the row blocks of each generalized row layer may be organized in an arbitrary order, and are not restricted to being only consecutive row layers in the PCM. Additionally, the number of row blocks in each generalized row layer could be different from one generalized row layer to another. The generalized row layer structure of the PCM provides the ability to perform processing of at least $d_v$ sub-matrices in parallel without data access conflicts.

In spite of the prior art described above, there is still a strong need for LDPC decoders that can provide significantly lower error rate performance and operate at much higher throughputs while still maintaining a low hardware cost. One of the major problems with conventional LDPC decoders is the problem of error floor" where the decoders can not achieve a low enough error rate that is inadequate for many storage systems. Conventional approaches tend to use decoders that use large amounts of hardware resources and power to address the error floor problem and this increases further when high throughputs are required. Further, the hardware architectures of the decoder are required to be flexible so that the decoder can be tuned to particular conditions of the channel to achieve the best error rate performance. Also, previous literature and disclosures only focused on FAIDs for LDPC codes with fixed column-weight $d_v=3$, which are not sufficiently strong in terms of error correction to be used in storage applications. This present invention aims to address all these issues.

SUMMARY

In accordance with the present invention, a method and apparatus is presented related to iterative message-passing of low-density parity-check (LDPC) codes. The method, referred to as vertical layered finite alphabet iterative decoding, receives values from the channel belonging to a channel output alphabet as inputs, and operates on a parity-check matrix consisting of row blocks and column blocks of sub-matrices with processing done on one or more sub-matrices constituting a plurality of decoding blocks. In each processing, the method computes, updates, and passes messages belonging to a finite alphabet between variable nodes and check nodes of the Tanner graph of the code that are associated to a decoding block using a variable node update function and check node update function respectively. The processing traverses, in arbitrary order, the entire parity-check matrix from one decoding block to another decoding block either within a column block or across column blocks of the parity-check matrix. The method receives values from the channel that can constitute hard-decision inputs for hard-decision decoding, or soft-decision inputs for soft-decision decoding.

The method can use either a single or a plurality of decoding stages where in each decoding stage, it can use either the channel values, or the hard-decision estimates or soft-decision estimates that were generated from the previous decoding stage, as inputs. During the computation of outgoing messages at the variable nodes of the graph that are associated to a decoding block, one or more different variable node update functions may be used in each decoding stage to further improve the probability of successful decoding. The method is applicable to both fixed-column-weight and variable column-weight LDPC codes.

In one of the embodiments of the method, the decoding block is a single sub-matrix, and the processing traverses from one decoding block to another decoding block within a column block, in arbitrary order. Such method is referred to as single sub-matrix vertical layered decoding. In another embodiment, the decoding block is an entire column block with the processing traversing across column blocks, and the method operates on a parity-check matrix consisting of generalized row layers with the number of row layers at least equal to the maximum column block degree of the parity-check matrix. Such method is referred to as single column vertical generalized layered decoding. In another embodiment, the decoding block contains one or more column blocks of the parity-check matrix, and the processing traverses, in arbitrary order, from one decoding block to another decoding block across groups of column blocks. Such method is referred to as multi-column vertical layered decoding.

An apparatus for a vertical finite alphabet iterative decoder is presented with various embodiments, where the apparatus comprises a module which is responsible for iteratively updating and passing messages between one or more variable node processors and one or more check node processors, and a module for checking whether the decoder has converged to a codeword and outputting the codeword. In accordance with a embodiment, the apparatus further comprises an initialization module used to compute the syndrome bits. The apparatus can perform hard-decision decoding or soft-decision decoding based on the inputs received, and also can use either a single or a plurality of decoding stages.

Various embodiments of the apparatus and their components are presented as part of this invention for the single sub-matrix vertical layered decoder, single column vertical generalized layered decoder, and the multi-column vertical layered decoder. The various embodiments presented allow for very efficient hardware implementations of the decoders that achieve very high throughputs with low hardware resource usage and power usage. The present invention is applicable for systems and applications employing LDPC codes such as flash controllers of solid state drive systems, embedded memory systems, and broadly any storage and communication system employing LDPC codes including wireless and optical communications. The apparatus in the present invention is also applicable to both field programmable gate array (FPGA) based applications as well as application specific integrated circuit (ASIC) based applications. We will now describe in more detail by way of examples and the accompanying drawings, various non-limiting embodiments and preferred embodiments of the methods and apparata of the present invention.

BRIEF DESCRIPTION OF THE DRAWINGS

The accompanying drawings, which are included to provide a further understanding of the invention are incorporated in and constitute a part of this specification, illustrate non-limiting embodiments of the invention, and together with the description serve to explain the principles of the invention.

DETAILED DESCRIPTION

The method in this disclosure relates to iterative message-passing decoding which operates on the parity-check matrix represented by a graph. A preferred embodiment of the method is operating on a parity-check matrix consisting of sub-matrices of size L×L. In another preferred embodiment, the L×L sub-matrices in the parity-check matrix are circulant permutation matrices (CPMs).

Figure 1:
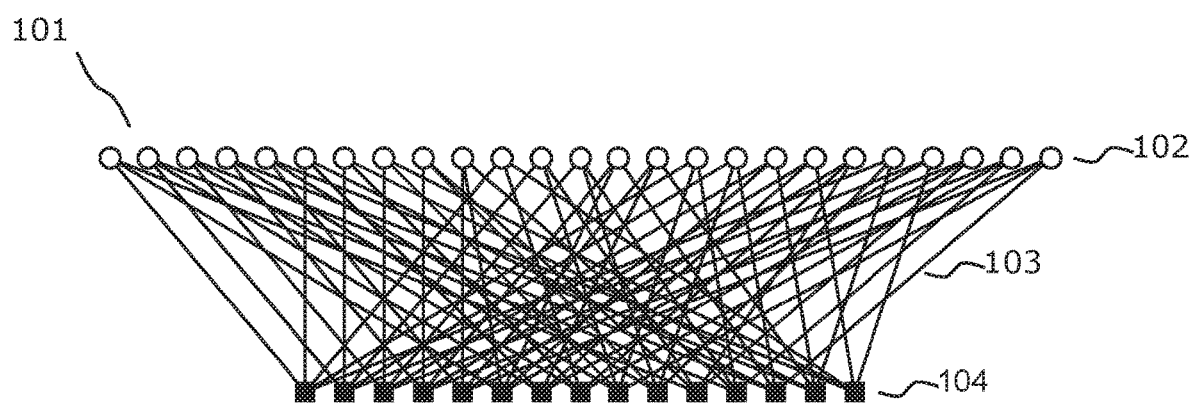
FIG. 1 shows an example of a Tanner graph G for a low-density parity-check code that has a column weight of 3.
Figure 2:
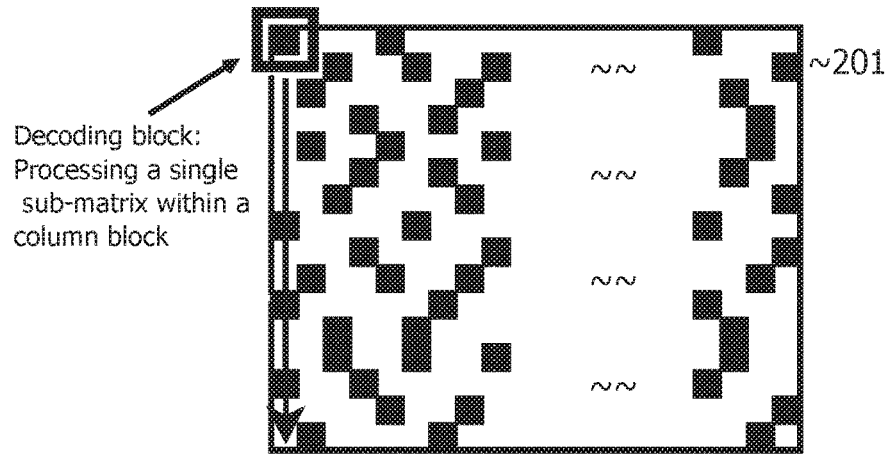
FIG. 2 illustrates the method for vertical layered finite alphabet iterative decoding operating on a parity-check matrix consisting of sub-matrices, where the processing is on a single or plurality of sub-matrices, according to an embodiment.
Figure 2:
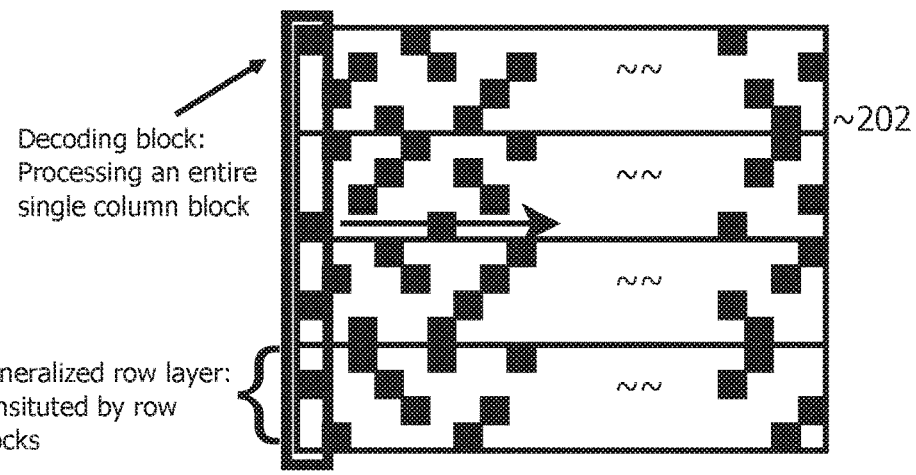
Figure 2:
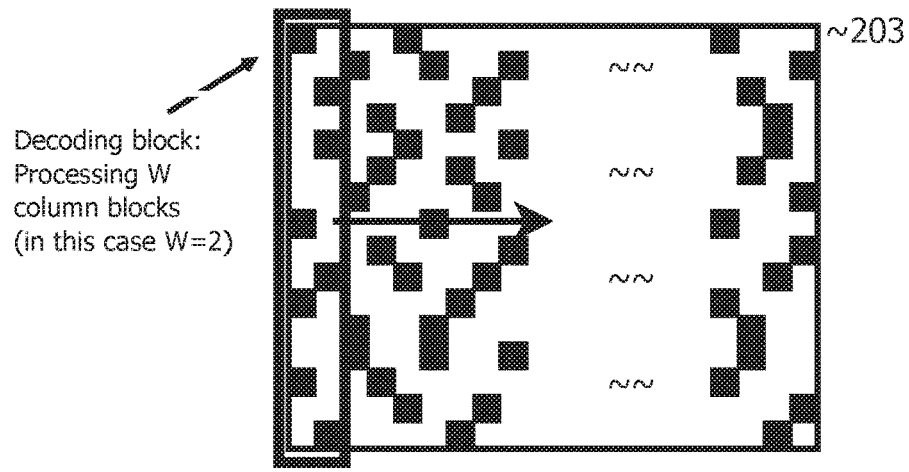

FIG. 2 depicts by way of example several embodiments of the method operating in a vertical layered manner on a parity check matrix consisting of sub-matrices. In FIG. 2, each square depicts a sub-matrix where the black squares indicate L×L non-null sub-matrices, and the white squares indicate L×L null sub-matrices. For the purposes of description of the various non-limiting embodiments of the method, we shall refer to a particular sub-matrix or a particular plurality of sub-matrices that are being processed during decoding collectively as a decoding block which is indicated by thick lines in FIG. 2.

In accordance with the decoding methods in the present invention, processing a single sub-matrix or a plurality of sub-matrices contained in a decoding block involves computing, updating, and passing messages between the variable nodes and check nodes associated with those sub-matrices on the graph of the code. The variable nodes and check nodes associated with a decoding block will be referred to as a variable node group and a check node group respectively.

The first decoding method presented in this disclosure is referred to as single sub-matrix vertical layered (SSVL) decoding, with one of its embodiments depicted by 201 of FIG. 2, in which the decoding block is a single L×L non-null sub-matrix. The processing is done sequentially from one non-null sub-matrix to another non-null sub-matrix within a column block of the parity-check matrix in arbitrary order, and across column blocks in arbitrary order. In a preferred embodiment, the order of processing starts with the first non-null sub-matrix in the first column block and then proceeds to the next non-null sub-matrix in that column block, as indicated by the arrow in 201 until the end of the column block is reached and then this is repeated in the next column block until the processing has traversed the entire parity-check matrix which completes one decoding iteration. The processing then goes back to the first non-null sub-matrix in the first column block to start the next decoding iteration and the processing continues until the decoding terminates.

The second decoding method presented in this disclosure is referred to as single column vertical generalized layered (SCVGL) decoding, with one of its embodiments depicted by 202 of FIG. 2, and in which the decoding block is one entire column block of the parity-check matrix. Further, this method operates on a parity-check matrix composed of $d_v$ generalized row layers, with $d_v$ being the maximum column block degree. This structure of the parity-check matrix particularly facilitates efficient implementations to achieve high throughput with low hardware complexity. In this method, the processing is done sequentially from one column block to another column block until all columns blocks of the parity-check matrix have been processed to complete one decoding iteration. The processing of the column blocks can be done in an arbitrary order across column blocks, and in a preferred embodiment of this method as illustrated by 202, the processing starts at the first column block, then proceeds to the next adjacent column block, and in this manner continues to traverse the entire parity-check matrix as indicated by the arrow in 202.

The third decoding method proposed in this disclosure is referred to as multi-column vertical layered (MCVL) decoding, with one of its embodiments depicted by 203 of FIG. 2, and in which the decoding block includes either a single column block or W column blocks. 203 shows the example of a decoding block composed of W=2 row blocks. The processing traverses from one group a column blocks to the next one, until all column blocks of the parity check matrix have been processed completing one decoding iteration. The order of processing of the groups of column blocks can be arbitrary.

The method for vertical layered finite alphabet iterative decoding (FAID) of the present invention begins by receiving the channel vector y that is a hard-decision input or a $n_q$-bit soft-decision input. For the purposes of exposition, throughout this disclosure, we will say a codeword is being processed when the decoding method is in the process of recovering the codeword from y, and we will say that a codeword is decoded when the decoding method has successfully converged to a codeword, i.e. for which the syndrome is zero (following Eq. 2).

In a preferred embodiment of the invention, the messages belong to a finite alphabet defined by $\mathcal{M} = \{0, \pm L_i : 1 \le i \le s\}$ of cardinality $|\mathcal{M}| 2s+1$. A message is therefore represented in $n_s$ bits of precision, with $n_s = \lceil \log_2(2s+1) \rceil$, and such a FAID will be referred to as a $n_s$-bit FAID which can be applied to hard-decision input channels, or a $n_q$-bits soft-decision input channel, with channel output alphabet $y=\{\pm Y_1, \pm Y_2, \ldots \pm Y_q\}$.

The minimum number of VN maps required by the method for determining the outgoing messages from the variable nodes depends on the cardinality of the channel output alphabet used by the method, and is often equal to the number of different negative (or positive) values in the channel output alphabet, i.e. q values, as the VN maps corresponding to $+Y_i$ can be deduced by symmetry from the VN maps corresponding to $-Y_i$, from Eq. 3. Alternatively, the VN maps corresponding to can also be deduced by symmetry from the VN maps corresponding to $+Y_i$. For purpose of exposition, and without loss of generality, we define the FAID by their VN maps corresponding to $-Y_i$. For hard-decision decoding where $y \in \{\pm Y\}$, the FAID is defined by a single VN map: $\Phi_v(-Y, m_1, \ldots, m_{d_v-1})$, $m, \in \mathcal{M}$. For soft-decision decoding, the FAID is defined by q VN maps: $\Phi_v(-Y_j, m_1, \ldots, m_{d_v-1})$, $m_i \in \mathcal{M}$, $1 \le j \le q$.

In the first iteration, all messages are set to zero. The variable nodes in the variable node group of the first decoding block receive their corresponding channel values. Based on the channel values, the outgoing messages from the variable nodes are computed using a VN Map $\Phi_v$ which is a function of the incoming messages and the channel value defined as $$\Phi_v : y \times \mathcal{M}^{d_v-1} \to \mathcal{M} \qquad (9)$$

and these outgoing messages are then passed along the edges incident to the variable nodes to their neighboring check nodes in the check node group of the decoding block. As an example, a variable node $v_i$ that has degree $d_v=4$ in the variable node group of the first decoding block sends the message $\Phi_v(y_i, 0, 0, 0)$. Numerous embodiments of $\Phi_v$ are still within the scope of this disclosure where $\Phi_v$ can be defined as a closed-form function, a look-up table, an arbitrary map or any other applicable embodiment which is considered within the scope of the present invention. In this manner, all variable nodes of the variable node group in the first decoding block send messages to the check nodes in the check node group of the decoding block.

The check nodes in the check node group of the first decoding block then receive messages and use the check node update function $\Phi_c$ to compute their outgoing messages. A preferred embodiment of the function used in the method of the current disclosure is the same function that was described in Eq. 4. If the decoding block consists of an entire column block or a plurality of column blocks, then the check nodes in the check node group compute the new outgoing messages as soon as they receive their messages from the neighboring variable nodes in the variable node group. If the decoding block is a single sub-matrix block, then check nodes in the check node group have to wait until all the non-null sub-matrix blocks in the column block have been processed before sending out their outgoing messages back to the variable nodes in the variable node group. Efficient implementations for the check node update will be subsequently discussed in one or more embodiments when describing the apparatus for the SSVL decoding method.

The computation and updating of messages described previously is repeated on the second decoding block and subsequent decoding blocks until the entire parity-check matrix has been traversed which then constitutes one decoding iteration, and then the decoding processing restarts again from the first decoding block to start the next decoding iteration.

At the end of processing of one or more decoding blocks of passing messages between variable node groups and check node groups, a hard-decision estimate $\hat{x}_i$ for each variable node $v_i$ is computed and sent to the validator to check if the decoding has converged to a codeword. The hard-decision estimates are determined using the function $\Psi$ that accepts as arguments all the incoming messages and the channel value $y_i$ of the variable node $v_i$. The function $\Psi$ can be an arbitrary Boolean function, or an algebraic function. Let $m_1, \ldots, m_{d_v}$ denote the $d_v$ incoming messages to a variable node $v_i$ of degree $d_v$. In one of the preferred embodiments, $\Psi$ can be defined as a sum of all the incoming messages and the channel value:

$$\Psi(y_i, m_1, \ldots, m_{d_v}) = Q\left(y_i + \sum_{j=1}^{4} m_j\right) \quad (10)$$

where $Q(x)=0$ if x is positive and $Q(x)=1$ if x is negative.

Further, in one or more embodiments of the method, the overall decoding process uses a single or a plurality of decoding stages in order to improve the rate of successful decoding in recovering the codeword from the channel vector y. A decoding stage is defined by a pre-defined number of $n_1$ decoding iterations as described in reference to FIG. 2, i.e. the initialization, the updating and passing of messages between variable nodes and check nodes, and the validation, and for a decoding stage, the method uses a set of VN maps and inputs. During decoding with channel vector y as input, the parameters associated with the parity-check matrix stay the same, but the parameters used by the decoding method could change from one decoding stage to another. For example, in one non-limiting embodiment of the method, different decoding stages may involve the use of different VN maps corresponding to a channel value in order to further improve the error correction capability of the decoding method. In another non-limiting embodiment of the method, both the inputs to the decoding method and the set of VN maps used can change from one decoding stage to the next. The description below further explains the mechanism for using a plurality of decoding stages by the method by way of example for the case of two stages.

Let $VNmap_1$ be the set of VN maps used in the first decoding stage and $VNmap_2$ be the the set of VN maps used in the second decoding stage by the method. Also let $n_i^1$ denote the maximum number of decoding iterations allowed for the first decoding stage, and let $n_i^2$ be the maximum number of decoding iterations allowed for the second decoding stage. If the method has failed to converge to a codeword in the first decoding stage using $VNmap_i$ after $n_i^1$ decoding iterations, then a second decoding stage is triggered for another $n_i^2$ iterations. At the beginning of the second decoding stage, the method is re-initialized with all messages being set to zero, and the inputs to the method are either the channel values, the hard-decision estimates generated at the end of the $n_i^1$-th iteration of the first decoding stage, or the soft-decision estimates generated at the end of the $n_i^1$-th iteration of the first decoding stage, and the computation of the estimates are further explained below. The method then uses $VNmap_2$ instead of $VNmap_1$ for computing the outgoing messages of the variable nodes for the entire second decoding stage.

The hard-decision estimates or p-bit soft-decision estimates or both are computed at the variable nodes using a function A defined as $$A: y \times \mathcal{M}^{d_v} \to \mathcal{L} \quad (11)$$

where $\mathcal{L}$ is the soft-decision output alphabet with cardinality $|\mathcal{L}|\geq 2$. The function A takes as its arguments all the $d_v$ incoming messages of a particular variable node $v_i$ with degree $d_v$ and its channel value $v_i$ to determine the hard-decision or soft-decision estimate $\lambda_i$ of the variable node $v_i$. If the cardinality of $\mathcal{L}$ is only 2, then $\lambda_i$ is a hard-decision estimate, and if the cardinality of $\mathcal{L}$ is greater than 2, then $\lambda_i$ is a p-bit soft-decision estimate where $p=\lceil \log_2 |\mathcal{L}| \rceil$.

An apparatus for the present invention shall now be described. For purposes of illustration and ease of exposition, we consider QC-LDPC codes where the L×L sub-matrices are CPMs. Although some embodiments of the apparatus may be described for the case of a specific column block degree $d_v$ by way of example for illustrative purposes, the apparatus is applicable to LDPC codes that have fixed or variable column weight, and any column block degree $d_v$, as easily evident for one skilled in the art. A preferred embodiment of the apparatus is when the messages are 3-bit messages belonging to a finite alphabet $\mathcal{M} = \{0, \pm L_1, \pm L_2, \pm L_3\}$.

Further, for purposes of exposition, we will say the the apparatus is working on the current processed codeword when the channel vector y corresponding to that particular codeword is currently being used by the apparatus to recover that codeword, which the apparatus accepts as input the channel vector corresponding to the next processed codeword which is waiting to be processed in the apparatus, which starts after completion of the decoding on the current processed codeword.

Figure 3:
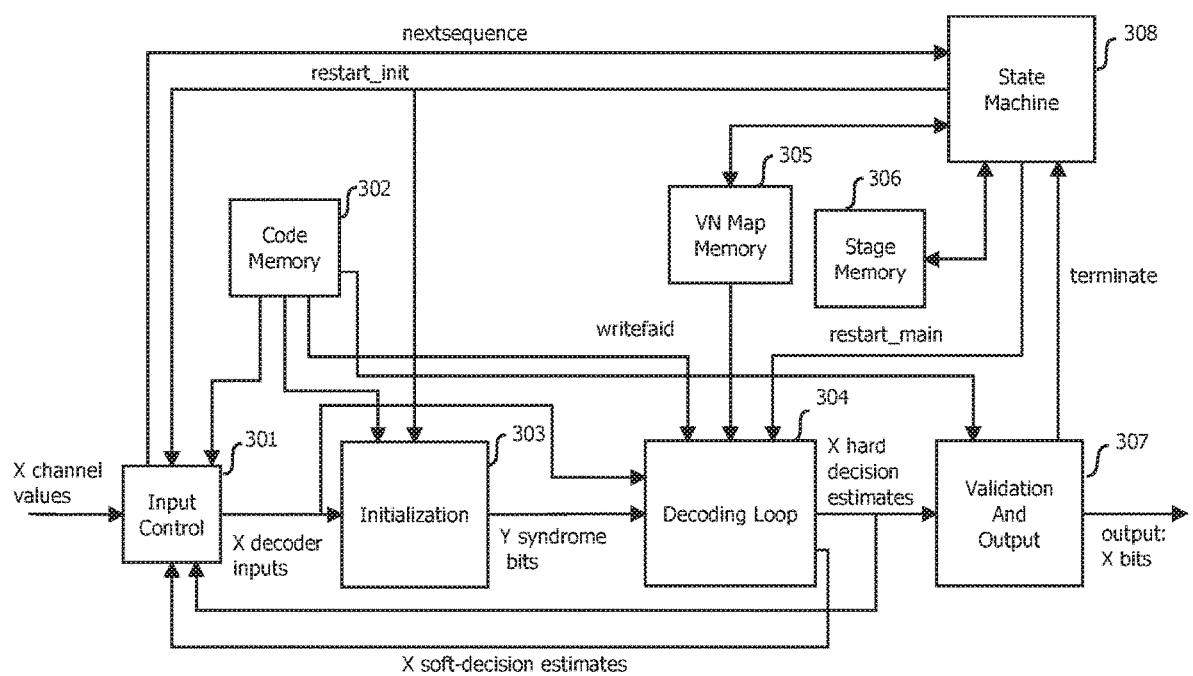
FIG. 3 shows an apparatus describing the top-level decoder architecture for the single sub-matrix vertical layered (SSVL) decoder, the single column vertical generalized layered (SCVGL) decoder, and the multi-column vertical layered (MCVL) decoder, according to an embodiment.

FIG. 3 illustrates a preferred embodiment of the apparatus for the present invention that implements vertical layered FAID, which constitutes a decoder. The apparatus depicted in FIG. 3 shows the top-level decoder architecture used to implement the three SSVL, SCVGL and the MCVL decoding methods, which constitute the SSVL, SCVGL, and MCVL decoders respectively. The inputs to the decoder are composed of X channel values extracted from the channel vector y, and the outputs of the decoders consist of the X bits of the decoded codeword. The channel values can be either hard-decision inputs or $n_q$-bit soft-decision inputs, and X corresponds to the number of inputs that a decoding block for a specific decoder needs in order to perform a processing. In the case of the SSVL decoder, the apparatus uses a parity-check matrix where the circulant size L is divisible by the maximum column degree $d_v$ of the parity-check matrix, and there are $X=L/d_v$ inputs and outputs to the decoder. In the case of the SCVGL decoder, there are X=L inputs and outputs to the decoder, and finally, in the case of the MCVL decoder, there are X=W*L inputs and outputs to the decoder, where W is the number of column blocks present in the decoding block and henceforth shall be referred to as such for the remainder of this disclosure.

The top-level decoder architecture shown in FIG. 3 consists of five main modules (301, 303, 304, 307, 308), and three memory blocks (302, 305, 306), which are described below.

input control 301: This module controls the input to the decoder by accepting X channel values. The module also sends relevant information about the channel values to the state machine module 308 which includes the mode of the decoding (hard-decision or soft-decision) depending on whether the input is hard-decision input or $n_q$-bit soft-decision input. The module is also responsible for sending the appropriate inputs to the initialization module 303 and to the decoding loop module 304. In the embodiments of the apparatus that uses a plurality of decoding stages during decoding, the input control sends X channel values for the first decoding stage, but for the subsequent decoding stages, it decides whether to send X data of either the channel values, or the hard-decision estimates or soft-decision estimates that were generated as an output of the decoding loop module 304 from the previous decoding stage. In order to send the appropriate data to these modules, 301 receives commands from the state machine 308, and accesses the code memory 302 to obtain the relevant parameters associated with the input data, such as the index of their column block which is being processed.

code memory 302: This memory block contains memory units to store information related to the various different code parameters that may be utilized by the decoder, along with the order in which the decoder must output the decoded codeword bits. In the preferred embodiment of the apparatus, for every column block in the parity-check matrix, the code memory stores the $d_v$ CPM shift values and the $d_v$ addresses of the non-null CPMs present in that column block, and some additional control bits. In the case of the SCVGL decoder, 302 also stores the generalized row layer index of each non-null CPM present in the column block, which specifies the row layer containing the non-null CPM within the generalized row layer, along with the address of the non-null CPM within the generalized row layer. As an example, in a preferred embodiment of the SCVGL decoder, and for a QC-LDPC code with a parity-check matrix that has a circulant size L=32, $d_v$=4 generalized row layers composed of $M_b/d_v$=32 row blocks, and $N_b$=1024 column blocks, the code memory would contain the following memory units in order to store four different sets of parameters:
- 40 bits wide, 1024 bits deep memory to store code information for initialization: CPM shift values and addresses.
- 40 bits wide, 1024 bits deep memory to store code information for main-loop and validation: CPM shift values and addresses.
- 10 bits wide, 1024 bits deep memory to store the order in which the bits must be output.

initialization 303: In the first decoding stage, this module computes the syndrome of the channel values based on the X inputs received from the input control module 301, and sends Y syndrome bits to the decoding loop module 304. The number of syndrome bits that are output by the initialization module at a given instant depends on the decoder. Y=L for the case of the SSVL decoder, Y=$d_v$*L for the case of the SCVGL decoder, and Y=$M_b$*L for the case of the MCVL decoder. In subsequent decoding stages beyond the first decoding stage, the module computes the syndrome bits based on the input values, which are either the channel values in the channel vector y that was input to the apparatus, or the hard-decision or soft-decision estimates in $\lambda$ that were generated as one of the outputs of the decoding loop module in the previous decoding stage. The syndrome bits are progressively updated by performing an XOR operation between their current values and the new bits of input received by the initialization module as the processing traverses the parity-check matrix from the first decoding block to the next decoding block. Once 303 has sent all the syndrome bits, computed from the entire N input values of the channel vector y received by the decoder, to 304, and once it receives a 'restart_init' signal from the state machine 308, it is able to accept the next channel vector corresponding to the next processed codeword. The decoding loop module 304 can still process the input data and syndrome bits of the current processed codeword, while 303 starts accepting bundles of X channel values for the next processed codeword.

decoding loop 304: This is the module that is responsible for computing, and passing the messages iteratively between the variable node groups and check node groups of a decoding block for the SSVL, SCVGL or MCVL decoders. The module accesses the VN map memory block 305 in order to load the appropriate VN maps, indicated by the 'writefaid' signal in FIG. 3, which are used in the updating of messages by a variable node group. The module uses the syndrome bits sent from the initialization module as well as the channel values received from the input control module 301 as inputs in order to process messages between the variable node groups and check node groups, and compute hard-decision estimates as an output which is sent to the validation and output module 307, and also to the input control module 301 for possible use in the next decoding stage. In some preferred embodiments, the module also computes soft-decision estimates that are also sent to the input control module for possible use in the next decoding stage.

VN map memory 305: This memory block stores all the necessary VN maps required by the decoder for the various different code parameters and the decoding modes (hard-decision and soft-decision decoding) used by the decoder. The total amount of information stored in this memory block depends on the number of bits of precision $n_s$ used for the messages, the number of addresses required to store the output values of a VN map, and the number of VN Maps required for decoding. The width of this memory depends on the speed at which the decoding loop 304 is required to access. The 'writefaid' signal indicates that 304 accesses 305 to load the VN maps.

stage memory 306: In the embodiments which utilize a plurality of decoding stages, this memory stores information necessary for decoding in each decoding stage. The memory unit stores all the parameters required for a particular decoding stage which may include (but not limited to) the VN Maps used in that stage, whether the channel vector y or the estimates in $\lambda$ from the previous decoding stage are used as input to that decoding stage, and the total number of decoding iterations $n_1$ used for that decoding stage. The width and depth of the memory unit depends on the number of decoding stages that are used by the decoder.

validation and output 307: This module is responsible for checking whether the hard-decision estimates it received from the decoding loop 304 correspond to a codeword, i.e., if the syndrome is zero (following Eq. 2). The module has a memory unit to store the hard-decision estimates, and computes the syndrome each time it receives a bundle of X hard-decision estimates from 304. The module 307 sends a 'terminate' signal to the state machine 308 whenever a decoded codeword is stored in its memory unit or whenever it decides to terminate the decoding after it has failed to converge to a codeword after the maximum allowed number of $n_1$ iterations. Combined with sending the 'terminate' signal, 307 sends the hard-decision estimates stored in the memory unit to the decoder output. In a preferred embodiment of the invention, the module 307 sends the hard estimates to the memory unit storing the decoder output by bundles of X bits.

state machine 308: This module is primarily responsible for managing all the various control signals sent to the modules (301, 303, 304, 307) based on the information in memories 305 and 306, and the control signals it receives from the modules 301 and 307. A typical operation of the state machine 308 for a decoder using a plurality of decoding stages is as follows. If the module 308 receives a 'terminate' signal from the validation and output module 307 indicating that the decoding has been successful, then 308 sends signals to the modules (303, 304, 307) to indicate that the current hard decision estimates can be output, and that the channel values corresponding to the next processed codeword can be used by the decoding loop 304 for processing. It also sends a signal to 301 to accept channel values for a new processed codeword.

If the state machine 308 receives a 'terminate' signal from the validation and output module 307 indicating that the decoding has failed, the module decides whether to restart and how to restart the decoding for the next decoding stage. If 308 decides to start a new decoding stage, it accesses the parameters required for the next decoding stage from 305 and 306, and sends the 'restart main' signal to modules 304 307 to indicate that the current processed codeword needs to be decoded starting with a new decoding stage. 308 sends also the necessary information about the new decoding stage to the modules 303 and 304, that is which VN Maps are required to be accessed by 304 for this decoding stage, and which decoder input y or the estimates in $\lambda$ are required in module 303 for this decoding stage.

Figure 4:
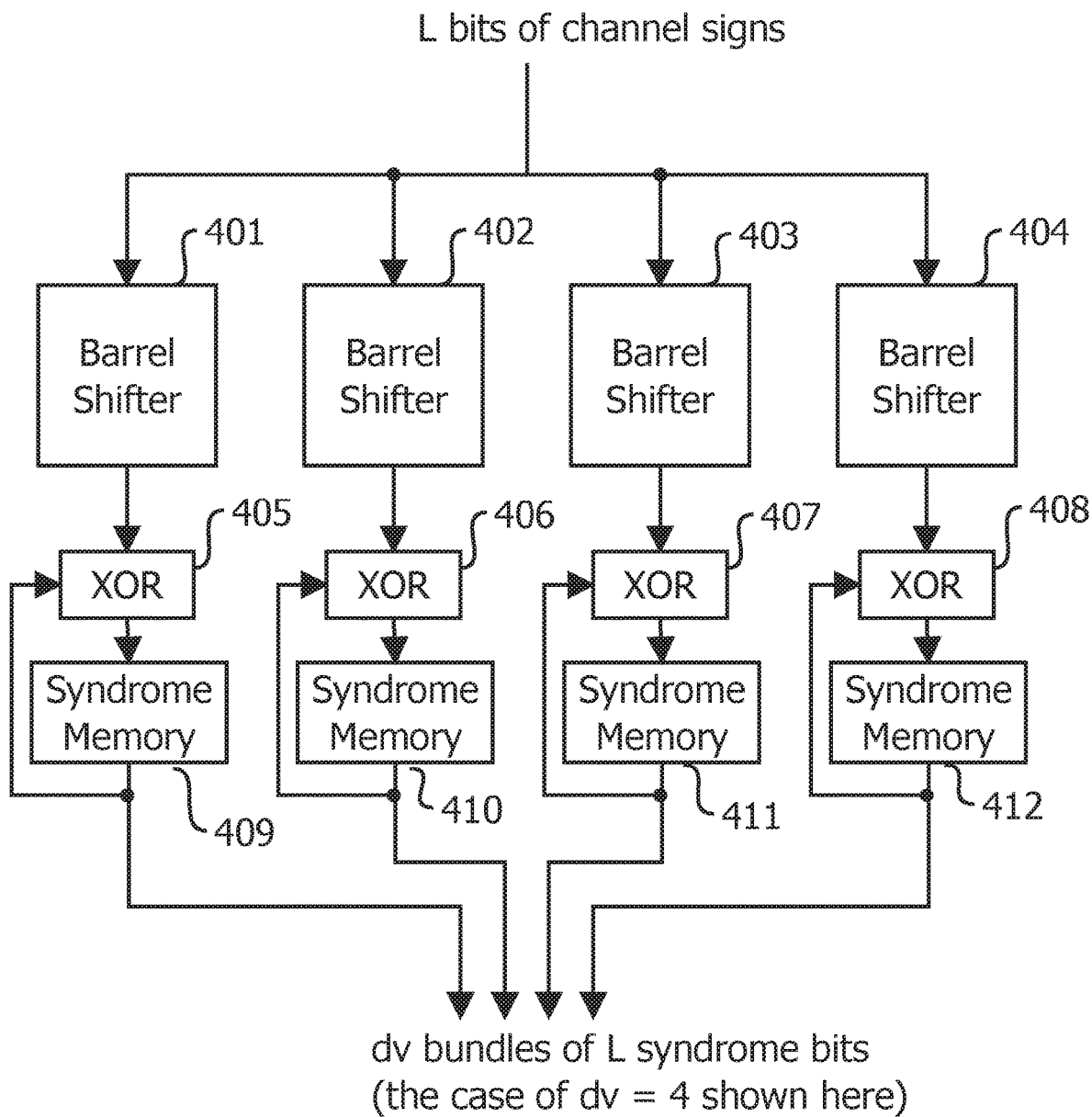
FIG. 4 shows an architecture of the initialization module used in the case of the SCVGL decoder for column block degree of $d_v=4$ and when the inputs to the module comprise the channel values, according to an embodiment.

A preferred embodiment of the initialization module 303 used as part of the top-level-decoder architecture in the apparatus of this invention for the SCVGL decoder is depicted in FIG. 4 by way of an example for the case of $d_v=4$, and when the inputs to the initialization module are the signs of the channel values. For the SCVGL decoder, since the parity-check matrix is structured into $d_v=4$ generalized row layers, the syndrome is a vector composed of $d_v=4$ different sub-vectors, each of them containing the syndrome bits of the row blocks that constitute each generalized row layer. This module 303 consists of barrel shifters (401-404), XOR units (405-408), and syndrome memory units (409-412), described below.

barrel shifters (401-404): the $d_v$ barrel shifters receive a set of L bits corresponding to the signs of the channel values which are henceforth referred to as channel signs, and cyclically permute those bits by an amount that depends on the PCM shift values of the $d_v$ non-null CPMs in the column block.

XOR and syndrome memory: the syndrome bits of the $d_v$ generalized row layers are stored in $d_v$ syndrome memories (409-412), where each memory has width L and a depth that is given by the number of row blocks within each generalized row layer, which is equal to $M_b/d_v$. The syndrome bits in the memories are updated by performing an XOR between the content of the memory and the shifted channel signs. In this manner, the syndrome bits are updated by (405-408), and stored in (409-412), as they continue to receive the channel signs of each new bundle of X channel values. Once the processing has traversed all decoding blocks, all the channel signs have been processed, and the final syndrome of the channel vector y is stored in the $d_v$ syndrome memories. The syndrome bits remain in the memories until a restart_init_signal is received after which point the syndrome is sent out from the $d_v$ memories to the decoding loop module 304.

Figure 5:
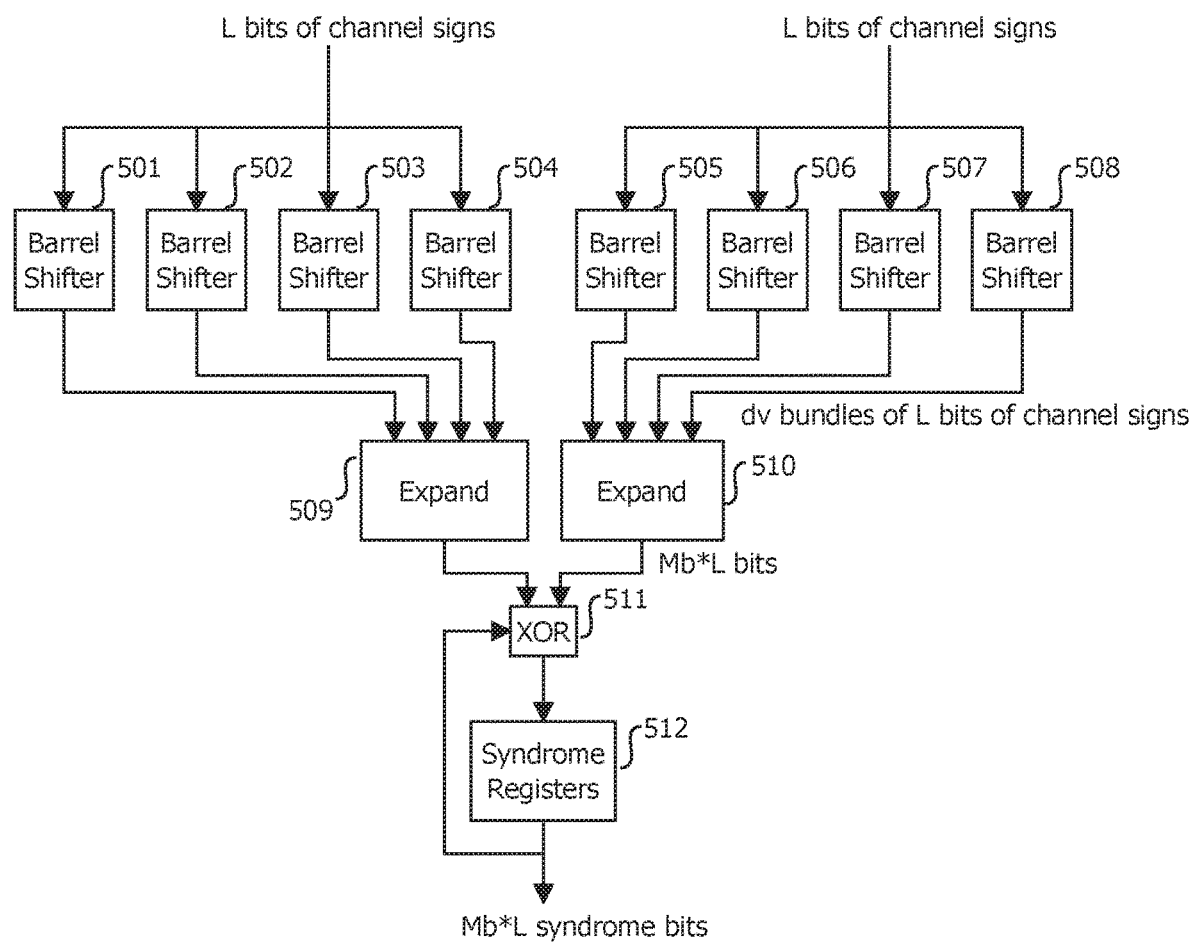
FIG. 5 shows an architecture of the initialization module used in the case of the MCVL decoder for column block degree $d_v=4$ and the number of column blocks contained in a decoding block being W=2, according to an embodiment.

A preferred embodiment of the initialization module 303 used as part of the top-level-decoder architecture in the apparatus of this invention for the MCVL decoder is shown in FIG. 5 by way of an example for the case of $d_v=4$, W=2, and when the inputs to the initialization module are the signs of the channel values. The initialization module for the MCVL decoder contains some of the same units as for the SCVGL decoder, i.e. barrel shifters (501-508), a XOR unit 511, but also additional Expand units 509 and 510. Further, in a preferred embodiment, the syndrome bits are stored in a set of $M_b*L$ registers 512, rather than in a memory.

Since the decoding block for the MCVL decoder is composed of W column blocks of the parity-check matrix, there are L*W channel signs at the input of this module. Each group of L channel signs corresponds to a column block, which is first cyclically permuted by the barrel shifters units, with the corresponding CPM shift values that are provided by the code memory 302. The Expand unit 509 takes the $d_v*L$ shifted channel signs at the output of the first set of barrel shifters (501-504), and places them in a length $M_b*L$ register, at their correct location, i.e. the row indices corresponding to the $d_v$ CPMs being processed. The Expand unit 510 proceeds the same way with the outputs of barrel shifters (505-508). The XOR unit 511 combines the channel signs at the output of the Expand units together, and also with the syndrome bits stored in the syndrome memory 512.

Figure 6:
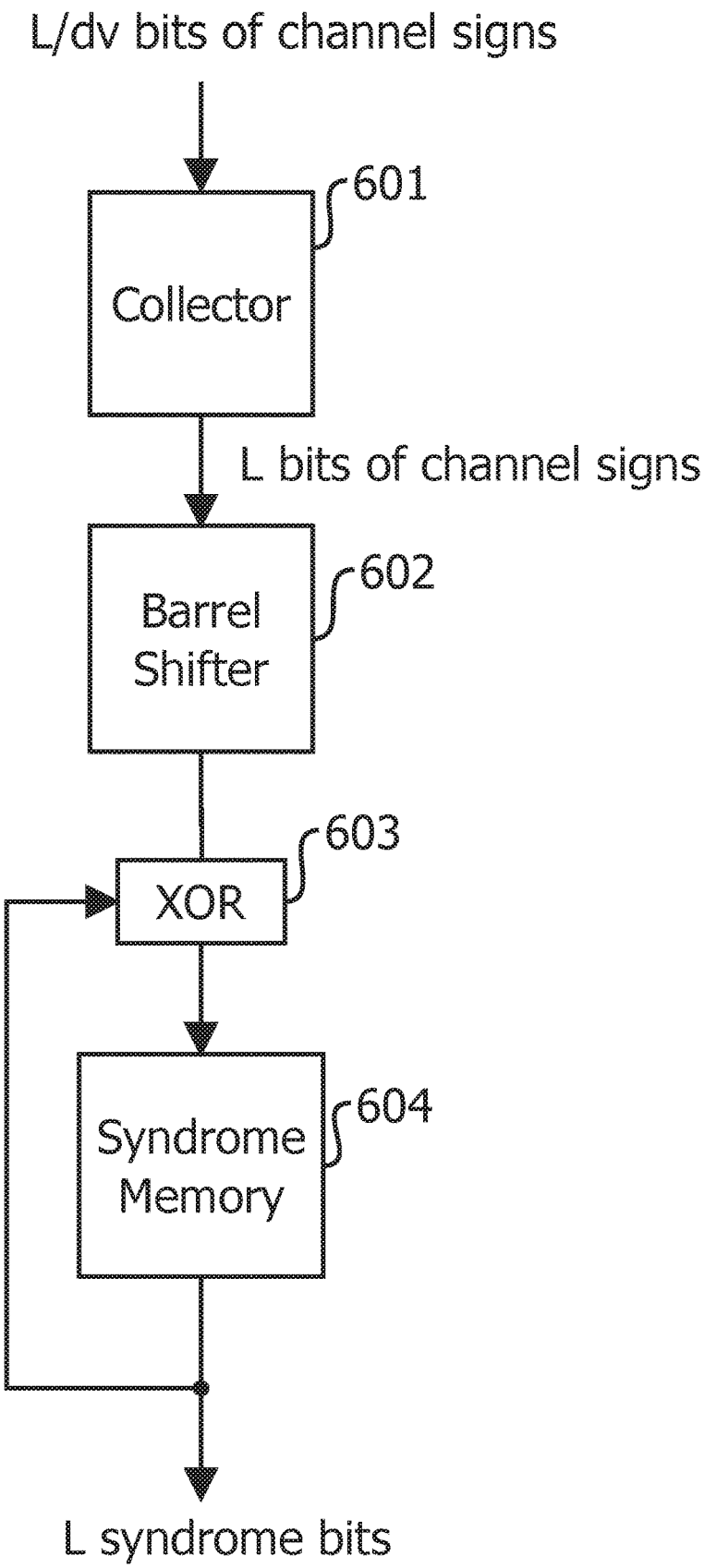
FIG. 6 shows an architecture of the initialization module in the case of the SSVL decoder, according to an embodiment.

A preferred embodiment of the initialization module 303 used as part of the top-level-decoder architecture in the apparatus of this invention for the SSVL decoder is shown in FIG. 6 by way of an example for the case when the inputs to the module are the signs of the channel values. This module contains the following units: A collector unit 601, a barrel shifter 602, an XOR unit 603 and syndrome memory units 64. The units (602-604) have the same functioning as for the SCVGL decoder of FIG. 4. The collector unit 601 is in charge of collecting the channel signs and transfering them to the barrel shifter.

In the SSVL decoder, the channel signs arrive at the input of the initialization module 303 by groups of $L/d_v$ bits. The collector unit 601 collects $d_v$ such groups, and combines them to obtain L bits of channels signs, which correspond to the column block containing the non-null CPMs being processed. The collected signs are barrel shifted by 602, with the CPM shift value of the processed decoding block. Then the L syndrome bits are updated at the address of the CPM, in the same manner as described previously in reference to FIG. 4.

Figure 7:
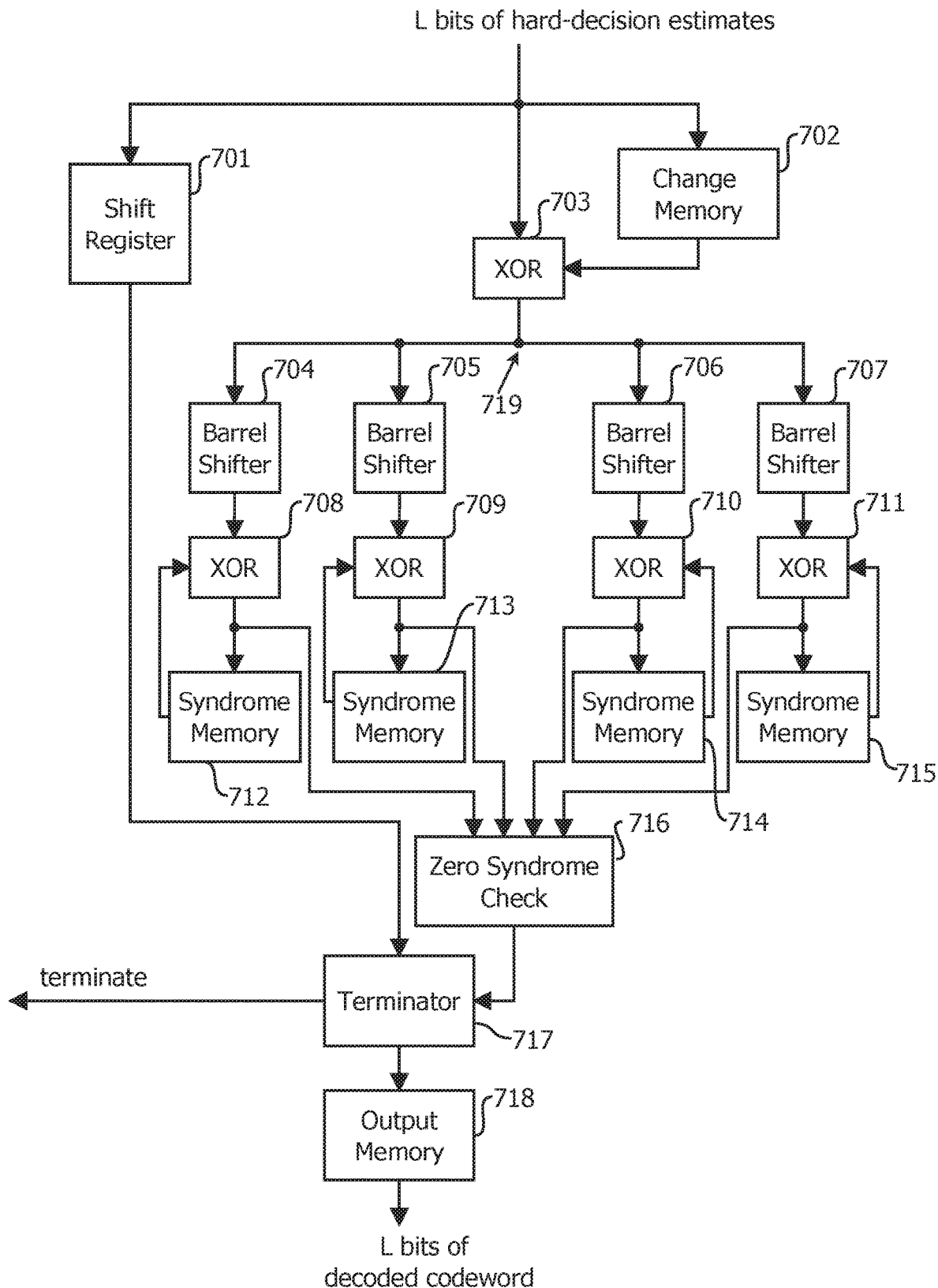
FIG. 7 shows an architecture of the validation and output module in the case of the SCVGL decoder for column block degree of $d_v=4$, according to an embodiment.

A preferred embodiment of the validation and output module 307 used as part of the top-level-decoder architecture in the apparatus of this invention for the SCVGL decoder is shown in FIG. 7 by way of example for the case of $d_v=4$. The module consists of the following units described below.

shift register 701: The shift register has a width of L bits and a depth equal to the number of pipeline stages in the validator. It stores the hard decision estimates as it is being received by the module, L bits by L bits, while the validator is determining whether the hard-decision estimates constitute a codeword.

change memory 702: The change memory contains the collection of the most recently computed hard-decision estimates. For example, when the module receives L hard-decision estimates corresponding to the j-th column block, the change memory contains the hard-decision estimates from the current iteration, for all blocks k<j, while it contains the hard-decision estimates from the previous iteration, for all blocks k≥j. This example assumes that the processing of the decoding blocks is done regularly from j=1 to j=$N_b$, and any other processing order of the decoding blocks would follow the same principle. When L new hard-decision estimates for the j-th column block arrive at the input of the module 307, then an XOR operation is performed by 703 with the corresponding values from the previous iteration (stored in 702). Therefore, the XOR unit 703 outputs the 'changes' in the hard-decision estimates, between the current iteration and the previous iteration. In addition to the XOR operation, the new L hard-decision estimates corresponding to the j-th column block of the current iteration are stored in the change memory 702. As a result, the flow of data 719 that enters the rest of the units is composed of the changes in hard decision estimates, rather than the hard decision estimates values themselves.

barrel shifters (704-707) and syndrome memory (712-715): The $d_v$ barrel shifters cyclically permute the data coming out of the XOR unit 703 by the CPM shift values of that particular column. Then the syndrome bits are updated from their previous values stored in memories (712-715), by the XOR units 708-711. The updated syndrome bits are stored in the syndrome memories, and sent to the zero syndrome check module 716. Since in the SCVGL decoder, the PCM is organized into $d_v$ generalized row layers, the syndrome bits are split into $d_v$ sub-sets, each of which is stored in a different syndrome memory. For example, 712 stores the syndrome bits corresponding to the first generalized row layer. Similarly, the barrel shifter 704 is responsible for processing the CPMs of the first generalized row layer only. Consequently, the syndrome memories each have a width of L bits and a depth that is equal to the number of row blocks in a generalized row layer, i.e. $M_b/d_v$.

zero syndrome check 716: The zero syndrome check unit checks whether the whole syndrome vector is all-zero, based on the changes in syndrome values that the new L hard decision estimates have affected. It sends a signal to the terminator unit 717 that indictates if the decoder has converged to a codeword.

terminator 717: The terminator unit decides whether to terminate the decoding based on the signal it receives from the the zero syndrome check unit 716. If it receives a signal that the syndrome is zero, then it sends a 'terminate' signal to the state machine module 308, and it will also indicate to the output memory 718 that the hard-decision estimates can be output as a decoded codeword. If it receives a signal that the syndrome is not zero, and that the maximum number of iterations in the current decoding stage has been reached, then it sends a terminate signal to the state machine 308, together with a signal indicating to trigger the next decoding stage or to stop the decoding if the maximum number of stages has been reached.

output memory 718: This memory block has two purposes. First, it stores the current decoded codeword that is ready to be output from the decoder. When the module or system downstream of the decoder is ready to receive the decoded codeword, the decoded codeword is output in groups of L bits. The output memory also starts collecting the hard-decision estimates of the next decoded codeword. The memory can then store two decoded codewords, has a width of L bits and a depth of 2*$N_b$.

Figure 8:
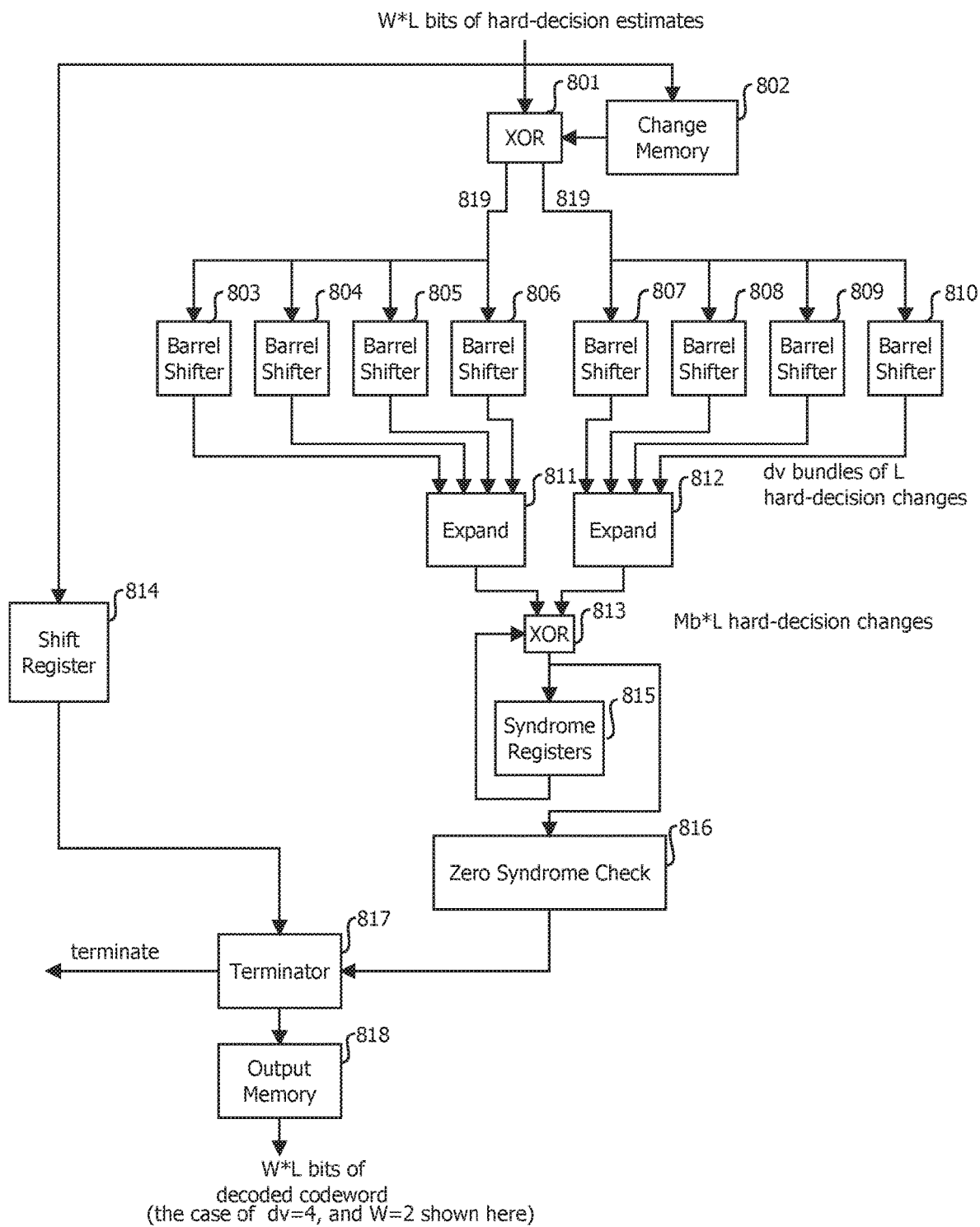
FIG. 8 shows an architecture of the validation and output module in the case of the MCVL decoder, for column block degree of $d_v=4$ and the number of column blocks contained in a decoding block being W=2, according to an embodiment.

A preferred embodiment of the validation and output module 307 used as part of the top-level-decoder architecture in the apparatus of this invention for the MCVL decoder is shown in FIG. 8 by way of example for the case of $d_v$=4 and W=2. The architecture is similar to the case of SCVGL decoder of FIG. 7, with the same differences that were implemented for the initialization modules 303, described in reference to FIG. 4 and FIG. 5. The validation and output module for the MCVL decoder takes L*W hard decision estimates as input and outputs L*W bits of the decoded codeword. It mainly contains the same elementary units as for the SCVGL decoder. We refer to the description associated with FIG. 7 for complete details:

the shift register unit 814 has the same functioning as 701, the change memory unit 802 has the same functioning as 702, the data streams 819 contain changes in hard-decision estimates, from the previous to the current iterations, as for 719, the barrel shifters units (803-810) have the same functioning as 704-707. Since the decoding block for the MCVL decoder is composed of W column blocks, there is now $d_v$*W=8 barrel shifters needed in the module, Two Expand units (811-812) connect the barrel shifters to the single XOR unit 813. Since in the MCVL decoder, the syndrome bits are stored in registers, the syndrome registers block 815 contains the $M_b$*L syndrome bits for the whole PCM.

the zero syndrome check unit 816 has the same functioning as 716, the terminator unit 817 has the same functioning as 717, the output memory unit 818 has the same functioning as 718, except that it outputs L*W bits at a time.

Figure 9:
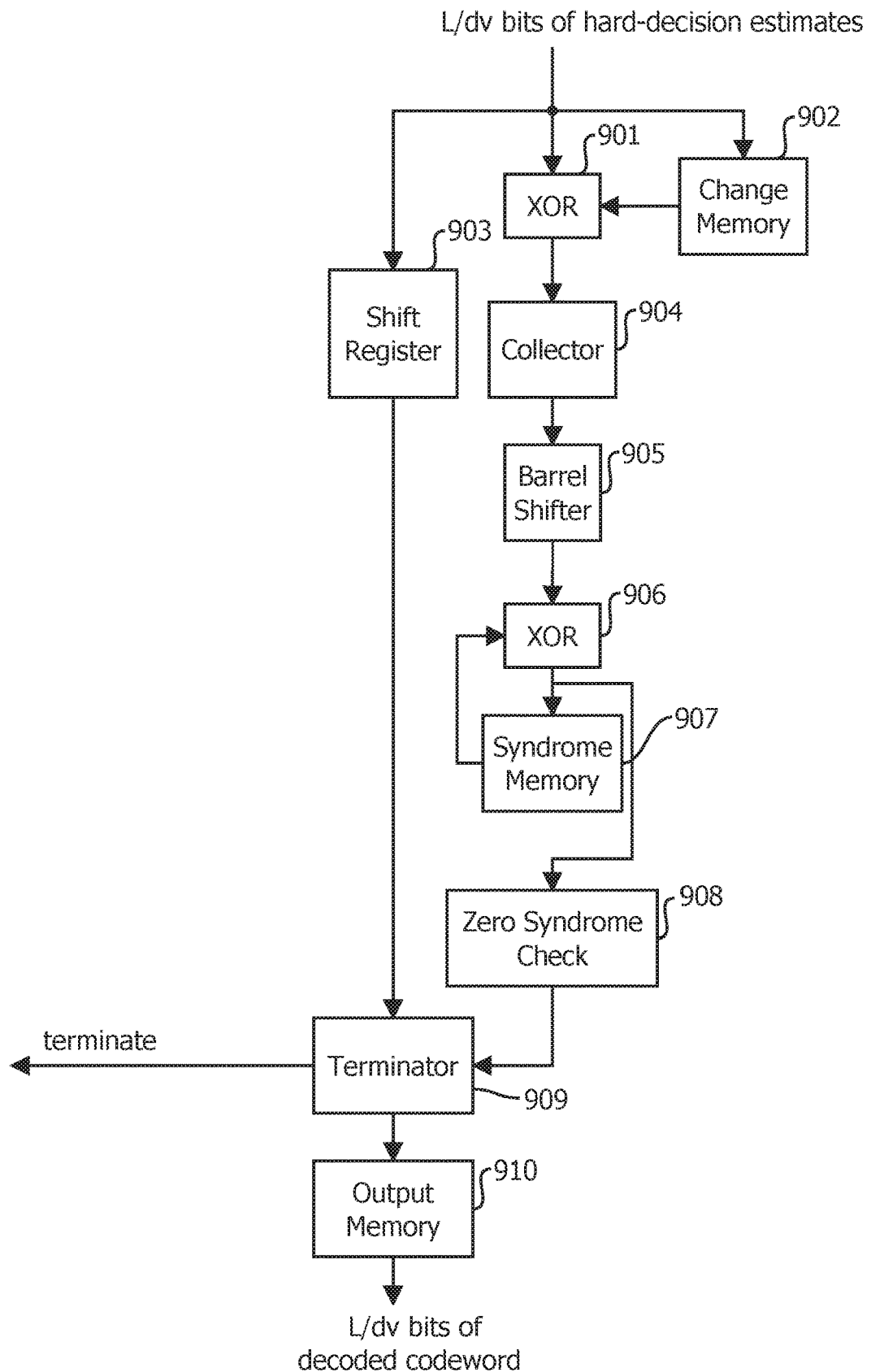
FIG. 9 shows an architecture of the validation and output module in the case of SSVL decoder, according to an embodiment.

A preferred embodiment of the validation and output module 307 used as part of the top-level-decoder architecture in the apparatus of this invention for the SSVL decoder is shown in FIG. 9 by way of example for the case of $d_v$=4. The architecture is similar to the case of SCVGL decoder of FIG. 7, with the same differences that were implemented for the initialization modules 303, described in reference to FIG. 4, FIG. 5, and FIG. 6. The validation and output module for the SSVL decoder takes L/$d_v$ hard decision estimates as input and outputs L/$d_v$ bits of the decoded codeword. It mainly contains the same elementary units as for the SCVGL decoder. We refer to the description in reference to FIG. 7 for complete details:

the shift register unit 903 has the same functioning as 701, the change memory unit 902 has the same functioning as 702, at the output of the XOR unit 901, there is an additional collector 904 used to collect every group of L/$d_v$ bits of hard-decision estimates until L bits of hard-decision estimates are received by the module, corresponding to a column block of the PCM. They are sent $d_v$ times to the barrel shifter, since there are $d_v$ non-null CPMs in the column block corresponding to those L collected hard-decision estimates.

the barrel shifter units 905 has the same functioning as 704-707. Note that in the SSVL decoder, only one barrel shifter is needed in the module.

the XOR unit 906 and the syndrome memory unit 907 update the L syndrome bits for the CPM being processed, the zero syndrome check unit 908 has the same functioning as 716, the terminator unit 909 has the same functioning as 717, the output memory unit 910 has the same functioning as 718, except that it outputs $L/d_v$ bits at a time.

Figure 10:
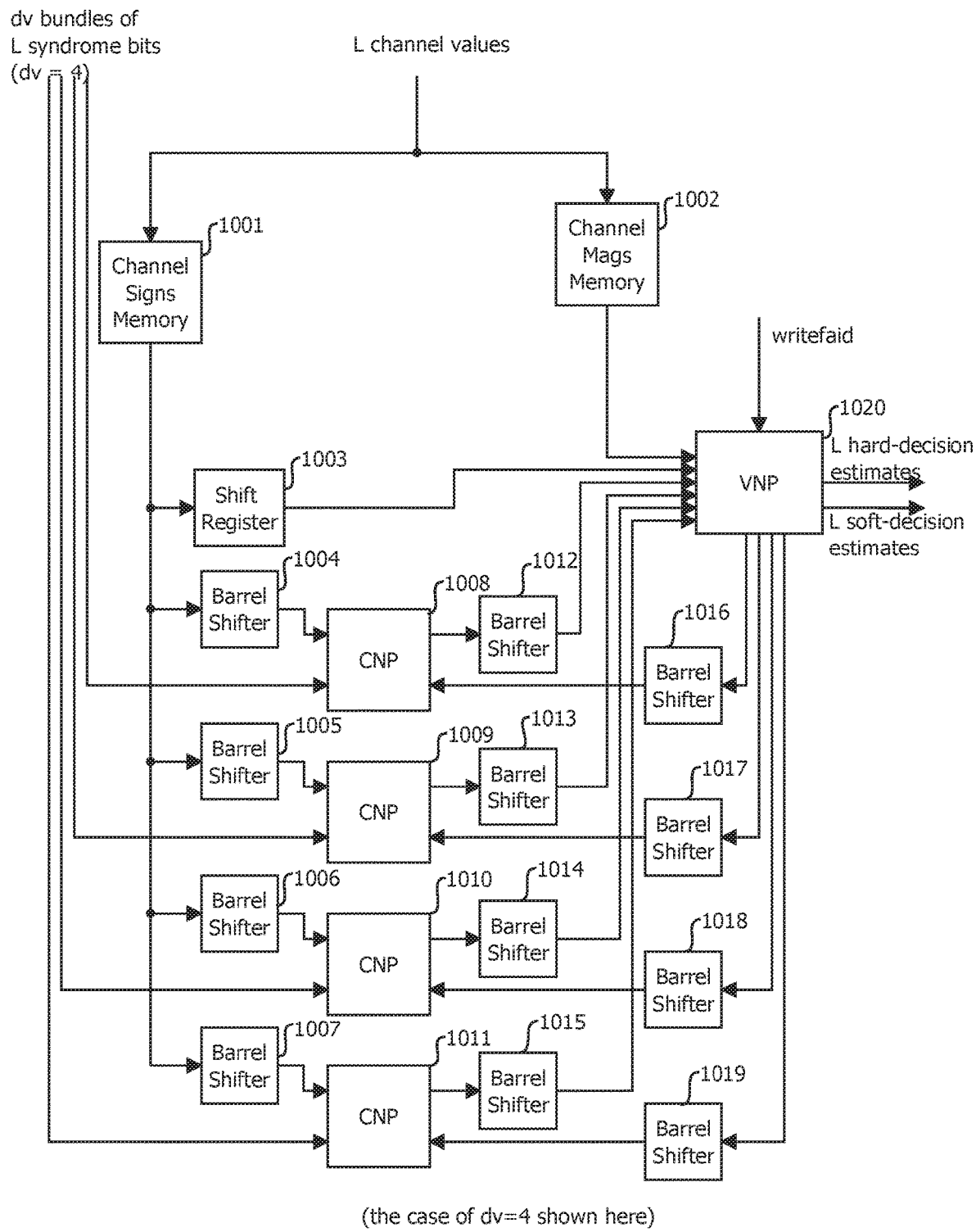
FIG. 10 shows an architecture of the decoding loop module in the case of the SCVGL decoder for column block degree of $d_v=4$, according to an embodiment.

We now describe in detail the decoding loop module 304 of the top-level decoder architecture. A preferred embodiment of the decoding loop module used as part of the top-level-decoder architecture in the apparatus of this invention for the SCVGL decoder is shown in FIG. 10 by way of example for the case of $d_v=4$, and when the inputs to the module comprise the channel values. The main units of this module are: the variable node processor 1020, the check node processors (1008-1011), barrel shifters (1004-1007) and (1012-1019), the shift register unit 1003, the channel signs memory 1001, and channel mags memory 1002. They are described below.

channel sign memory 1001: The channel sign memory is a memory unit that stores the signs of the channel values of the current processed codeword that is currently used by the decoding loop module as well as the signs of the channel values for the next processed codeword. The memory unit has a width L and depth equal to $2*N_b$.

channel mags Memory 1002: The channel mags memory is a memory unit that stores the bits representing the magnitude of the channel values, henceforth referred to as channel magnitudes for ease of exposition. The channel magnitudes are computed from the L channel values that enters the module. As in unit 1001, both the magnitudes of the channel values of the current processed codeword and the channel values of the next processed codeword are being stored in 1002. The channel mags memory has then a width of $L*(n_q-1)$ where $n_q$ is the number of bits of precision used to represent the channel values, and depth equal to equal to $2*N_b$.

variable node processor 1020: The variable node processor (VNP) unit is responsible for computing the outgoing messages from the variable node group in the decoding block as well as the hard-decision estimates, and the soft-decision estimates if used by the decoder in a decoding stage. The unit receives as inputs, the channel signs from 1001, the channel magnitudes from 1002, as well as the $n_s$-bit messages from the check node processors (CNPs) (1008-1011), through the barrel shifters (1012-1015). It also receives the 'writefaid' signal from the state machine, which indicates which VN MAPs should be used during the current decoding stage. The unit computes the outgoing messages from the VNP which are sent back to the $d_v$ CNPs through the barrel shifters (1016-1019). It also computes the hard-decision estimates sent to the validation and output module 307 and soft-decision estimates. The hard-decision estimates and the soft-decision estimates are sent back to the input control module 303 when the state machine decides to trigger a new decoding stage.

check node processors (1008-1011): The check node processor (CNP) units are responsible for computing the outgoing messages from the check node group in the decoding block. In the SCVGL decoder, there are $d_v$ CNPs, each one used to compute the outgoing messages of the check nodes corresponding to a generalized row layer in the parity-check matrix. For example, in FIG. 10, the CNP 1008 computes the outgoing messages of the check nodes corresponding to the row blocks in the first generalized row layer. Each CNP receives L $n_s$-bit messages from the VNP through the barrel shifters (1016-1019), L shifted channel signs from the barrel shifters (1004-1007), and L syndrome bits corresponding to the rows of the CPM. The channel signs are needed during the first decoding iteration to compute the outgoing messages of the CNP from the syndrome bits. Once the messages in the CNP are processed, they are sent back to the VNP through the barrel shifters (1012-1015).

barrel shifters: There are three sets of $d_v$ barrel shifters used in the decoding loop module. Each set responsible for cyclically permuting either the messages or the channel signs for the CPM present in the column block being processed. As the PCM is organized in generalized row layers, and each generalized row layer contains a single CPM, the $d_v$ barrel shifters in each set are assigned to different generalized row layers. For example, the barrel shifters (1004, 1012, 1016) are processing the data in the first generalized row layer. The barrel shifters set (1012-1015) permutes L messages of $n_s$ bits, according to the CPM shifts values of that column block, from the VNP to the CNPs. The set of barrel shifters (1004-1007) permutes L bits of channel signs in that column block. The set of barrel shifters (1015-1019) permutes L $n_s$-bit messages, according to the inverse CPM shifts values of that column block, from the CNPs to the VNP.

shift register 1003: The shift register is used to regulate the flow of data of the L channel signs being sent to the VNP so that the VNP receives the channel signs which correspond to the same decoding block as the messages that the VNP receives from the CNP. The depth of the shift register depends on the number of clock cycles needed to traverse the sequence of units (barrel shifter—CNP—barrel shifter), which itself depends on the number of pipeline stages used in the CNP unit.

The decoding loop module in the preferred embodiment shown in FIG. 10 for SCVGL decoder begins the decoding process by receiving the $d_v$ bundles of L bits of the syndrome. These data streams are then sent to the $d_v$ CNPs and used to initialize the memories contained in the CNPs. After the syndrome bits have been stored in the CNPs, the L bits of channel signs are read from the channel signs memory unit 1001, shifted by (1004-1007), and sent to the CNPs (1008-1011). The CNPs generates the outgoing messages, which are then barrel shifted with the inverse CPM shift values (1015-1019), and sent to the VNP 1020. As seen in Eq. 4, the CNP update uses the signs of the messages obtained from the VNP to compute the outgoing messages. In the first iteration, those signs are not available yet, and they are deduced from the barrel shifted channel signs, read from the channel signs memory 1001. From the second iteration and the subsequent iterations, the CNPs use the signs of the messages they received from the VNP, instead of the channel signs.

When the messages at the output of the CNPs are available, the VNP accesses the $d_v$ bundles of L $n_s$-bit messages, along with the L bits of channels signs of the same block column, from the shift register 1003, as well as the L channel magnitudes from 1002. The VNP generates $d_v$ bundles of L $n_s$-bit messages that are sent to the $d_v$ CNPs through the barrel shifters (1012-1015). The VNP also computes hard-decision estimates that are sent to the validation and output module 307. In some preferred embodiments, the VNP also computes soft-decision estimates that are sent to the input control module 303 for use in the next decoding stage.

The decoding loop module continues in this manner to exchange newly updated messages between the VNP and the CNPs iteratively, until a 'restart' signal is received by the decoding loop module from the state machine 308, indicating that the current decoding stage is completed (successfully or not).

Figure 11:
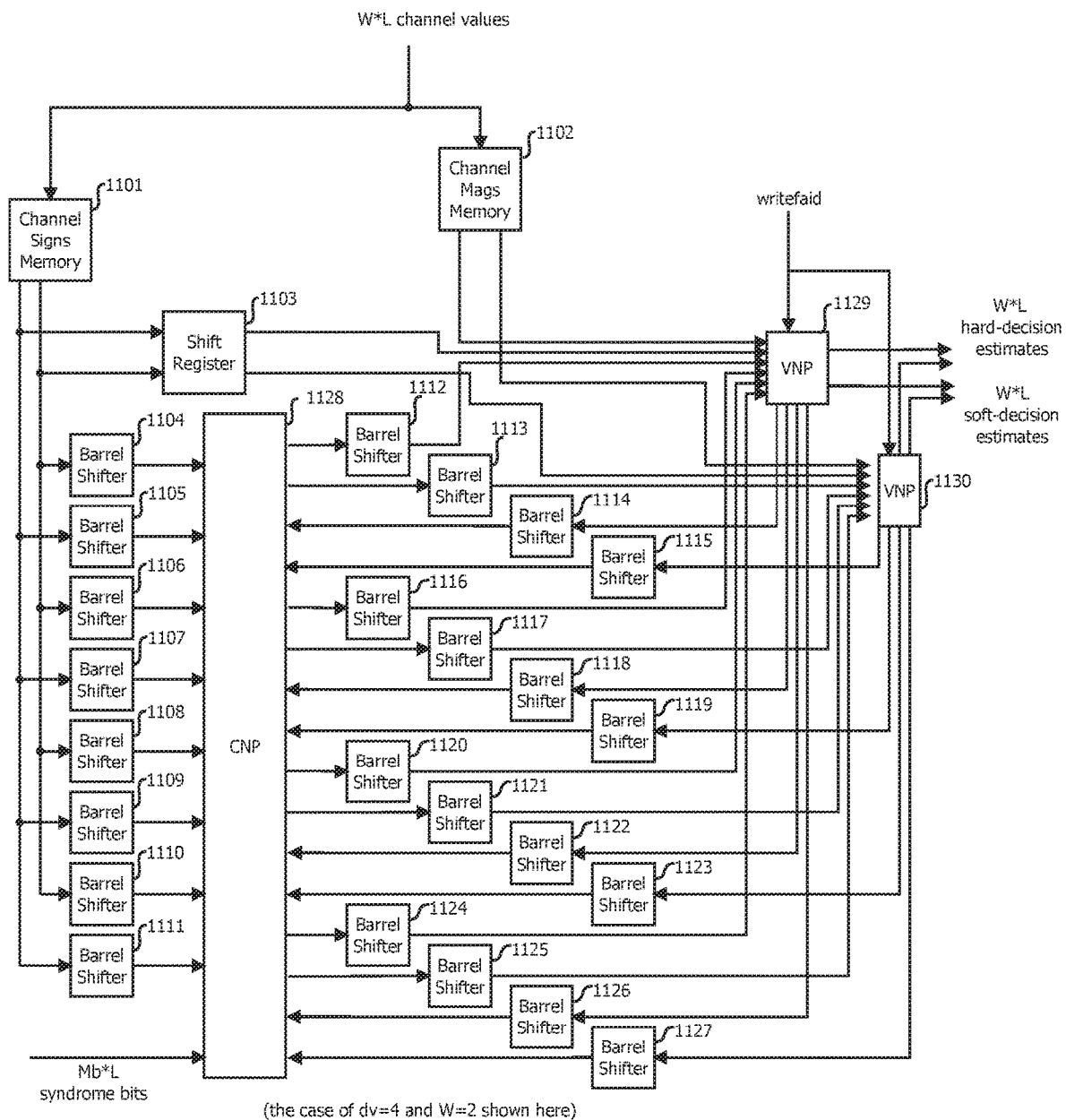
FIG. 11 shows an architecture of the decoding loop module in the case of the MCVL decoder for column block degree of $d_v=4$ and the number of column blocks contained in a decoding block being W=2, according to an embodiment.

A preferred embodiment of the decoding loop module 304 used as part of the top-level-decoder architecture in the apparatus of this invention for the MCVL decoder is shown in FIG. 11 by way of example for the case of $d_v$=4, W=2, and when the inputs to the module comprise the channel values. The architecture is similar to the case of SCVGL decoder of FIG., with the same units composing the module: channel signs and magnitude memories, CNP and VNP units, barrel shifters, and a shift register. The total number of barrel shifters needed is $3*d_v*W$, with a first set of $d_v*W$ barrel shifters to permute the channel signs, and two other sets of $d_v*W$ barrel shifters to permute the $n_s$-bit messages. The decoding loop module also contains W VNPs instead of one for the SCVGL decoder. Another difference with the SCVGL decoder is that there is only one CNP module instead of $d_v$ modules, since for the MCVL decoder, the PCM is not organized by generalized row layers.

The decoding loop module accepts groups of L*W channel values, and receives $M_b*L$ syndrome bits from the initialization module 303. The module outputs L*W hard-decision estimates that are sent to the validation and output module 307, and in some preferred embodiments, it also outputs L*W soft-decision estimates that are sent to the input control module 301 for use in the next decoding stage. The functioning of the VNP, CNP and other units is the same as in the SCVGL case, and we refer to paragraphs 0078 and 0079 for more details.

Figure 12:
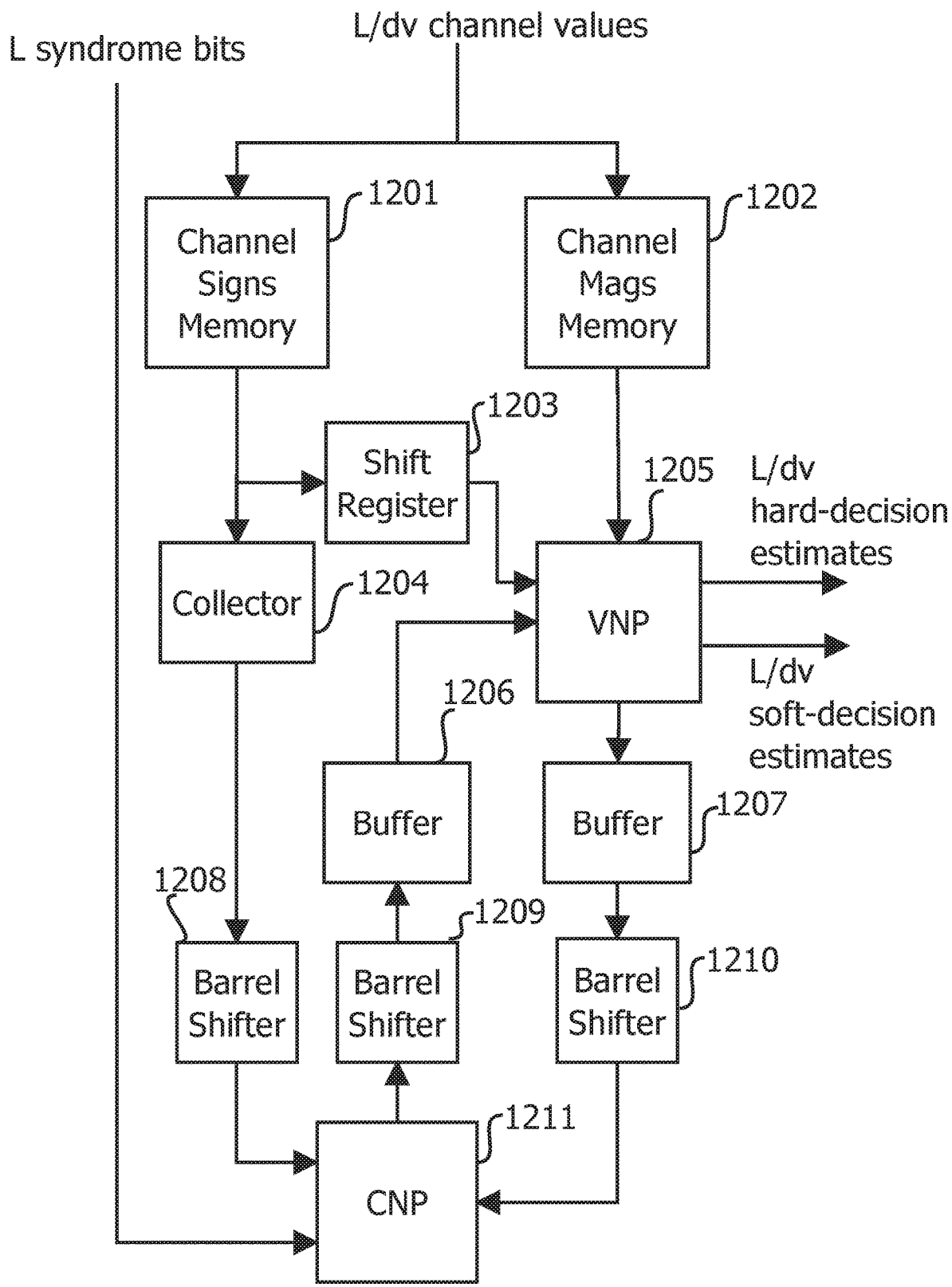
FIG. 12 shows an architecture of the decoding loop module, in the case of the SSVL decoder, according to an embodiment.

A preferred embodiment of the decoding loop module 304 used as part of the top-level-decoder architecture in the apparatus of this invention for the SSVL decoder is shown in FIG. 12 by way of example for the case of $d_v$=4 and when the inputs to the module comprise the channel values. The architecture is similar to the case of SCVGL decoder of FIG., with the same units composing the module: channel signs and magnitude memories, CNP and VNP units, barrel shifters, and a shift register. in addition to these same units, there are also a collector 1204, and two buffer units 1206 and 1207.

Since the SSVL decoder processes a single CPM in one column block at a time, there is only one barrel shifter 1209 needed to permute the messages from CNP to VNP, and only one barrel shifter 1210 from VNP to CNP. There is also a single barrel shifter 1208 needed to shift the channel signs. The decoding loop module accepts groups of $L/d_c$ channel values, and syndrome bits from the initialization module 303 and outputs groups of $L/d_v$ hard-decision estimates. In some preferred embodiments, the module also outputs $L/d_v$ soft-decision estimates.

The collector 1204 collects $d_v$ bundles of $L/d_v$ channel signs to combine them and form a single bundle of L channel signs, that is transmitted $d_v$ times to the barrel shifter 1208. The purpose of buffer 1206 is to re-arrange the order in which the messages are transmitted from the CNP to the VNP. Since the CNP processes one circulant at a time, it takes $d_v$ sequential steps to output all $d_v*L$ messages for a given column block. The VNP cannot process the variable nodes in the variable node group of the decoding block unless it has received these $d_v*L$ messages, but in a different order than it is output from the CNP. For example, the first decoding block corresponds to the $L/d_v$ first variable nodes of that column block, the processing of which requires the $L/d_v$ first messages within each group of L messages, output from the CNP. The buffer 1206 ensures that the VNP receives the appropriate set of messages for each decoding block. Similarly, buffer 1207 is used to send the appropriate set of messages from the VNP to the CNP. Except for the usage of the collector and the buffers, the rest of the units in this module have the same functioning as for the SCVGL decoder which were described previously.

Figure 13:
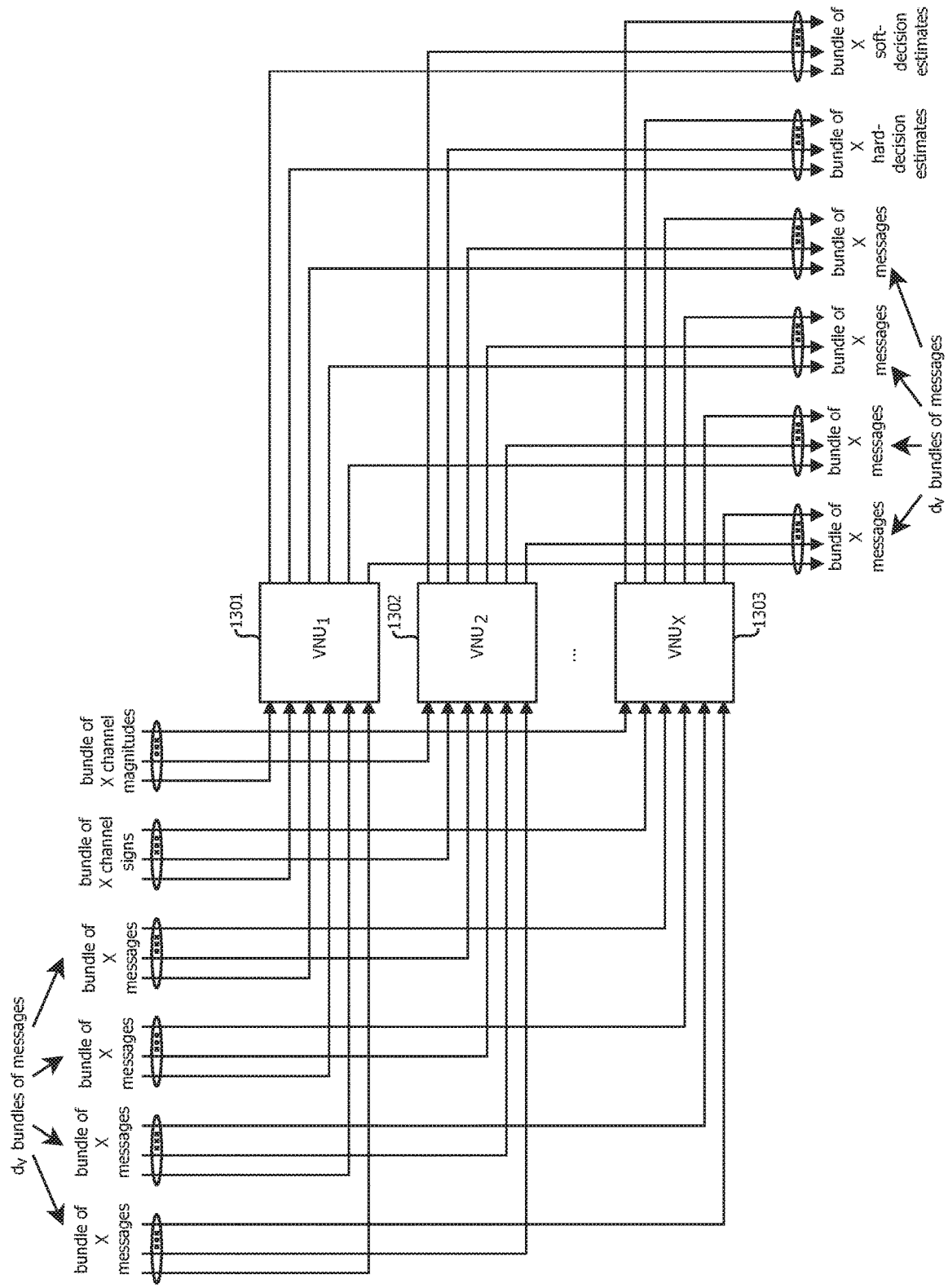
FIG. 13 shows an architecture of the variable node processor used in the decoding loop module of the SCVGL, MCVL, and SSVL decoders, according to an embodiment.

A preferred embodiment of the VNP unit used as part of the decoding loop module 304 in the apparatus of this invention is shown in FIG. 13. The embodiment can be used by all the three decoders for the unit 1020 in the SCVGL decoder, unit 1129-1130 in the MCVL decoder, and unit 1205 in the SSVL decoder.

The VNP unit accepts as inputs, $d_v$ bundles of X messages that come from the shifted outputs of one or more CNPs, X channel signs, and X channel magnitudes. The VNP consists of X variable node units (VNUs) (1301-1303), which generate the output messages based on the VN maps defined in the Background. The VNP unit outputs $d_v$ bundles of X messages to be sent back to one or more CNPs through barrel shifters, and also X hard-decision estimates. In some preferred embodiments, it also outputs X soft-decision estimates. The number of messages in each bundle is X=L in the case of the SCVGL decoder, and $X=L/d_v$ in the case of the SSVL decoder. In the case of the MCVL decoder, the number of messages in each bundle is X=L, but since the decoding loop module also contains W VNP units processing in parallel, the VNPs compute L*W messages.

Figure 14:
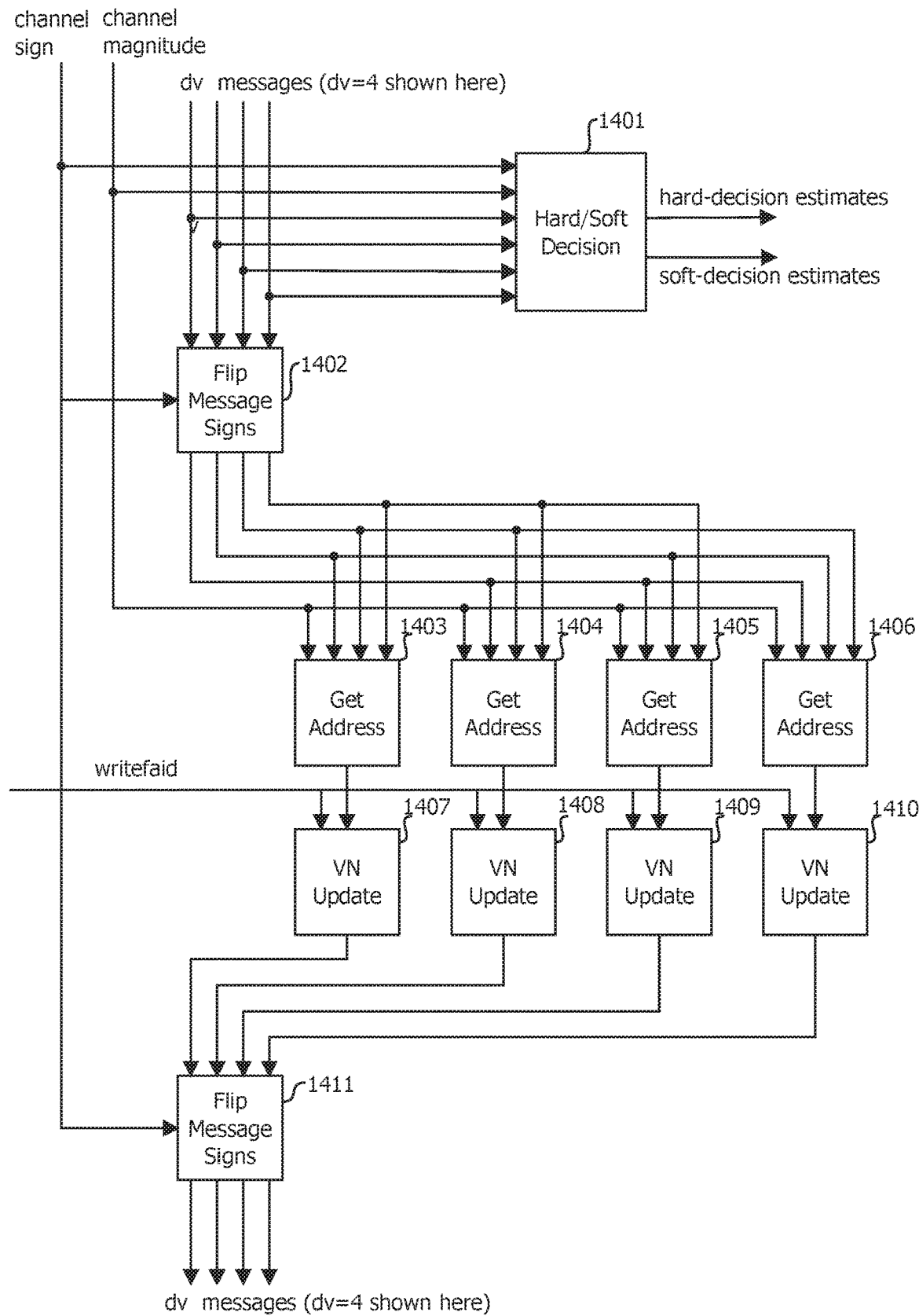
FIG. 14 shows an architecture of the variable node unit (VNU) used in the SCVGL, MCVL, and SSVL decoders, according to an embodiment.

A preferred embodiment of the VNUs 1301-1303 used in the VNPs (1020, 1129, 1130, 1205) of the decoding loop module 304 in the apparatus of this invention is shown in FIG. 14 by way of example for the case of $d_v$=4 and when the inputs to decoding loop module comprise the channel values. The preferred embodiment of the VNU described is identical for all the three decoders of SCVGL, MCVL, and SSVL. The various components of the VNU as shown in FIG. 14 are described below.

hard/soft decision 1401: this unit receives the $d_v$ messages along with the channel sign and channel magnitude as inputs in order to compute the hard-decision estimates. The hard-decision estimates are sent to the validation and output module 307, as well as to the input control module 303 when a new decoding stage is triggered. In some preferred embodiments, soft-decision estimates are also computed to be used for the next decoding stage. There are numerous embodiments for implementing this unit that one skilled in the art could consider such as a look-up table or a weighted sum of the inputs followed by a quantization, or any another non-linear function, and all these embodiments are part of this apparatus.

flip message signs 1402 and 1411: This unit is used to flip the signs of the messages so that the number of VN maps required to be stored in the VN map memory 305 is reduced. In a embodiment, where the VN maps stored in the VN maps memory unit 305 correspond to the negative channel values of the channel output alphabet, a flip message signs unit 1402 flips the $d_v$ messages that are input to the VNU when the channel value is positive, so that only the VN maps $\Phi_v(-Y_j, m_1, \ldots, m_{d_v-1})$ are required in the VN Update units (1407-1410) as explained in reference to FIG. 2. Similarly another flip message signs unit 1411 is used to flip the newly computed output messages when the channel value is positive in order to ensure the output message has the correct sign according to Eq. 3.

get address (1403-1406) and VN update (1407-1410): The variable node update (VN update) units determine the output messages based on the VN maps being used in the current decoding stage. In the case of all the three decoders SCVL, MCVL, and SSVL, the VNU computes $d_v$ messages in parallel, requiring therefore $d_v$ VN update units (1407-1410). Each VN update unit is a memory unit that stores the $n_s$-bit outputs corresponding to all the possible inputs to the VN maps $\Phi_v(-Y_j, m_1, \ldots, m_{d_v-1})$. The get address units (1403-1406) determines the appropriate address that needs to be accessed in the VN Update unit, based on the $d_v-1$ input messages and the channel magnitude. The get address unit transforms the $d_v-1$ $n_s$-bit input messages to an address which is then accessed by the VN update unit in its memory to send the output message. The width of the memory in each VN update unit is $n_s$, and its depth depends on the precision of channel values. For example, for a soft-decision decoder where the channel values are from a channel output alphabet that has cardinality 4, i.e. $y=\{\pm Y_1, \pm Y_2\}$, the memory would have twice the depth as for a hard-decision decoder. The 'writeFAID' signal coming from VN map memory module 305 writes the VN maps used in the current decoding stage into the VN Update unit memories.

Numerous preferred embodiments of the VN update units are possible that lead to efficient implementations based on the target application and considered within the scope of this invention. Although a preferred embodiment of the VNU was described using VN update memories, by way of example in FIG. 14, one skilled in the art can easily extend this implementation to other embodiments which may include combinatorial logic circuits, sum operators, or combinations of such with other logic and memory units.

Figure 15:
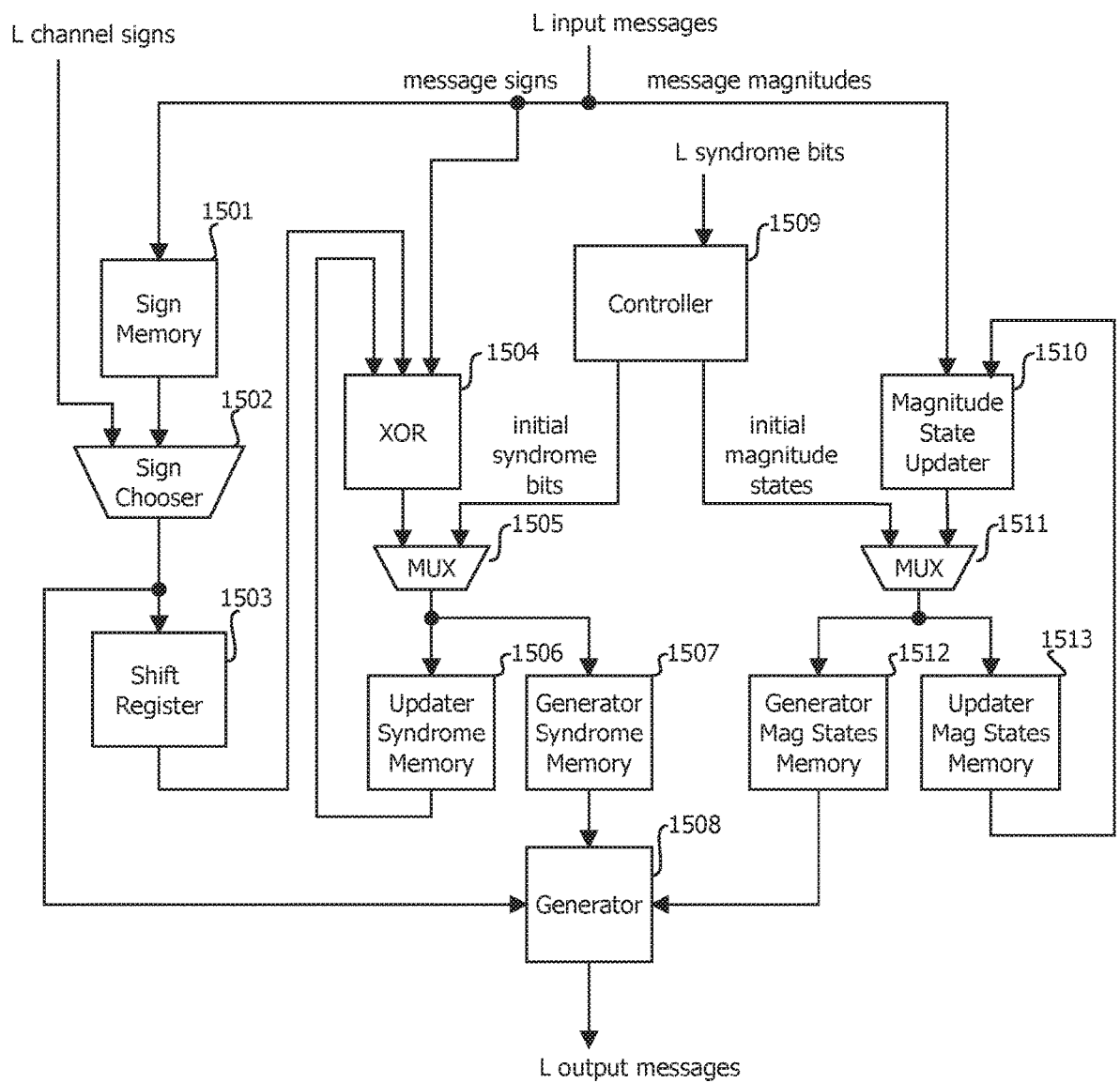
FIG. 15 shows an architecture of the check node processor used in the decoding loop module of the SCGVL and SSVL decoders, according to an embodiment.

A preferred embodiment of the CNP module 1020 used as part of the decoding loop module 304 in the apparatus of this invention for the SCVGL decoder is shown in FIG. 15, which is also identical for the case of the SSVL decoder, by way of example for the case when the inputs to the decoding loop module comprise the channel values. The inputs to the CNP module are L input messages from the barrel shifted outputs of the VNP, L channel signs to be used in the first iteration, and L syndrome bits. The module computes L output messages in two separate parts: 1) generating the signs of the output messages from the signs of the incoming messages also referred to as message signs in FIG. 15, and 2) generating the magnitudes of the output messages from the magnitudes of the input messages also referred to as message magnitudes in FIG. 15.

The CNP module 1020 computes the output messages by storing and updating the syndrome bits and magnitude states of the check nodes in the check node group that is being processed in the decoding block. The magnitude state of a check node of degree $d_c$ in the check node group, consists of a single or a plurality of magnitudes of the incoming messages along with their respective edge indices. An edge index within a magnitude state indicates which one of the $d_c$ edges connected to this check node contains the incoming message corresponding to the stored magnitude. The various units of the preferred embodiment of the CNP module are shown below.

controller 1509: This unit is responsible for initializing the CNP by loading the first data into the memories (1506-1507) and (1512-1513) which do not contain any data in the first decoding iteration. The unit receives L syndrome bits that are sent from the initialization module 303 and outputs the initial syndrome bits and initial magnitude states of the check nodes in the check node group. The initial syndrome bits are set to the values of the L syndrome bits that are being received by the unit, and the initial magnitude states are set to a value belonging to the message alphabet M. The chosen value for the magnitude states at the first iteration is arbitrary, and can be optimized for a given QC-LDPC code to maximize the error correction capability of the decoder. The two multiplexors (1505 and 1511) select the initial syndrome bits and initial magnitude states at beginning of the first iteration which are then sent to the appropriate memory units.

sign memory 1501: This memory unit stores the signs of the L input messages to be used in the next decoding iteration by the XOR unit 1504, and also to calculate the signs of the output messages in the generator 1508. The width of this memory is L, and its depth depends on the decoder used. The depth is the number of column blocks in the PCM, equal to $N_b$, for the SCVGL decoder, and $d_v * N_b$ for the SSVL decoder.

sign chooser 1502: This unit selects the appropriate signs to use for generating the output messages as well as updating the syndrome bits in the CNP. In the first decoding iteration, the sign chooser selects the signs which come from the channel sign Memory 1001 unit through the barrel shifters in the decoding loop module. For all subsequent iterations after the first iteration, the sign chooser selects the message signs from the sign Memory 1501.

shift register 1503: This unit is used to regulate the flow of signs from the sign chooser 1502 output, so that the signs of the messages from the previous iteration, which are stored in the sign memory 1501, are combined with the signs of the messages of the current iteration corresponding to the same edges in the XOR unit 1504. The depth of the shift register depends on the number of pipeline stages used in the decoding loop module 304.

XOR 1504: This unit performs an XOR operation between the signs of messages received by the CNP in the current decoding iteration and the signs that are stored in the shift register which represent the signs of the same messages from the previous decoding iteration. The result of this XOR operation correspond to the change in message signs from one iteration to another. This change in signs is then combined, using a XOR, with the current values of the syndrome bits that come from the updater syndrome memory 1506 in order to update the syndrome bit, which is the output of the XOR module. In the first iteration, the CNP receives its first messages from the VNP, and the message signs are combined with the initial signs from the channel signs memory. The updated syndrome bits are then stored in the updater syndrome memory block 1506 as well as the generator syndrome memory block 1507.

updater syndrome memory 1506 and generator syndrome memory 1507: These are two memory blocks used to store the syndrome bits of the check nodes with both containing identical data. They both have a width of L bits and a depth which depends on the decoder. The depth is equal to the number of block rows in a generalized row layer, equal to $M_b/d_v$, for the SCVGL decoder, and the depth is equal to $M_b$ for the SSVL decoder. The updater syndrome memory 1506 is used for accessing the syndrome bits in order to determine the updated syndrome bits, while the generator syndrome memory 1506 is used for accessing the syndrome bits in order to determine the signs of the output messages (or output message signs) of the CNP, that enter into the generator unit 1508. The use of two separate memory blocks allows the access of two different addresses simultaneously, one for the updating of syndrome bits, and the other for generating the output message signs.

updater mag states memory 1513 and generator mag states memory 1512: These are two memory blocks that store the magnitude states of the check nodes with both containing identical information. Similar to the reason for the updater syndrome memory 1506 and generator syndrome memory 1507, the updater mag state memory 1513 is accessed for updating the magnitude states and the generator mag states memory 1512 is accessed to determine the magnitudes of the output messages (or output message magnitudes) of the CNP, that enter into the generator unit 1508. In a preferred embodiment of the CNP, the magnitude state of a check node comprises the two lowest magnitudes, among all the magnitudes of the incoming messages that the check node has received during decoding, along with their respective edge indices. The two lowest magnitudes are denoted $mag_1$ and $mag_2$, and their respective indices are denoted $index_1$ and $index_2$, for purposes of exposition. Any generalization to a magnitude state containing a larger number of lowest magnitudes is also considered as part of this invention. In this preferred embodiment, the memories 1513 and 1512 have a width equal to $2*((n_s-1)+\lceil \log_2(d_c) \rceil)*L$, since one needs $n_s-1$ bits to store one message magnitude, and $\lceil \log_2(d_c) \rceil$ bits to store one edge index. The depth of the memories depend on the decoder: it is $M_b/d_v$ for the SCVGL decoder and $M_b$ for the SSVL decoder. In another preferred embodiment, the value of $index_2$ is not stored in the generator mag states memory 1512 as this is not required in the generation of the output messages. In this case, the memory 1512 has a width equal to $(2*(n_s-1)+\lceil \log_2(d_c) \rceil)*L$.

magnitude state updater 1510: This unit is used to update the magnitude state of every check node in the check node group based on the magnitudes of the incoming messages. The unit reads the old magnitude states from the updater mag states memory 1513, determines the updated magnitude states depending on the magnitudes of the input messages that are sent from the VNP, and then writes the updated magnitude states into the updated mag states memory 1513 and also to the generator mag states memory 1512. In the preferred embodiment of the CNP, where the magnitude state is composed of [$mag_1$, $mag_2$, $index_1$, $index_2$], the magnitude state updater 1510 proceeds the following way to compute the new magnitude states.

For a check node in the check node group being processed, the magnitude state updater 1510 receives a single message from the VNP, with magnitude $mag_{new}$ and index $index_{new}$.

1. First, the unit checks if the current index $index_{new}$ corresponds to an index stored in the magnitude state.
2. If ($index_{new}=index_1$), then the updated magnitude state is either [$mag_{new}$, $mag_2$, $index_{new}$, $index_2$] if ($mag_{new} \le mag_2$), or [$mag_2$, $mag_{new}$, $index_2$, $index_{new}$] if ($mag_{new} > mag_2$).
3. If ($index_{new}=index_2$), then the updated magnitude state is either [$mag_{new}$, $mag_1$, $index_{new}$, $index_1$] if ($mag_{new} \le mag_1$), or [$mag_1$, $mag_{new}$, $index_1$, $index_{new}$] if ($mag_{new} > mag_1$).
4. If the current index does not correspond to any of the stored indices, then the updated magnitude state is either [$mag_{new}$, $mag_1$, $index_{new}$, $index_1$] if ($mag_{new} \le mag_1$), or [$mag_1$, $mag_{new}$, $index_1$, $index_{new}$] if ($mag_{new} > mag_1$) and ($mag_{new} \le mag_2$), or [$mag_1$, $mag_2$, $index_1$, $index_2$] if ($mag_{new} > mag_2$).

generator 1508: This unit determines the signs and magnitudes of the output messages sent out of the CNP by accessing the syndrome bits from the generator syndrome Memory 1507, the magnitude states from the generator mag states memory 1512, and the signs from the sign chooser 1502. For a check node in the check node group being processed, the generator 1508 send a message to the VNP through the barrel shifters, corresponding to an index $index_{out}$ in the set of $d_c$ edges connected to the check node. In the preferred embodiment of the CNP, where the magnitude state is composed of [$mag_1$, $mag_2$, $index_1$, $index_2$], the output message magnitude will be $mag_2$ if the output edge index $index_{out}$ matches the edge index $index_1$. The output message magnitude will be $mag_1$ otherwise. The sign of the output message is determined by performing an XOR operation between the message sign selected by the sign chooser 1502 and the syndrome bit of that check node stored in the generator syndrome Memory 1507. The L output messages determined by the generator are then sent out to the VNP in the decoding loop module 304 through the barrel shifters.

Figure 16:
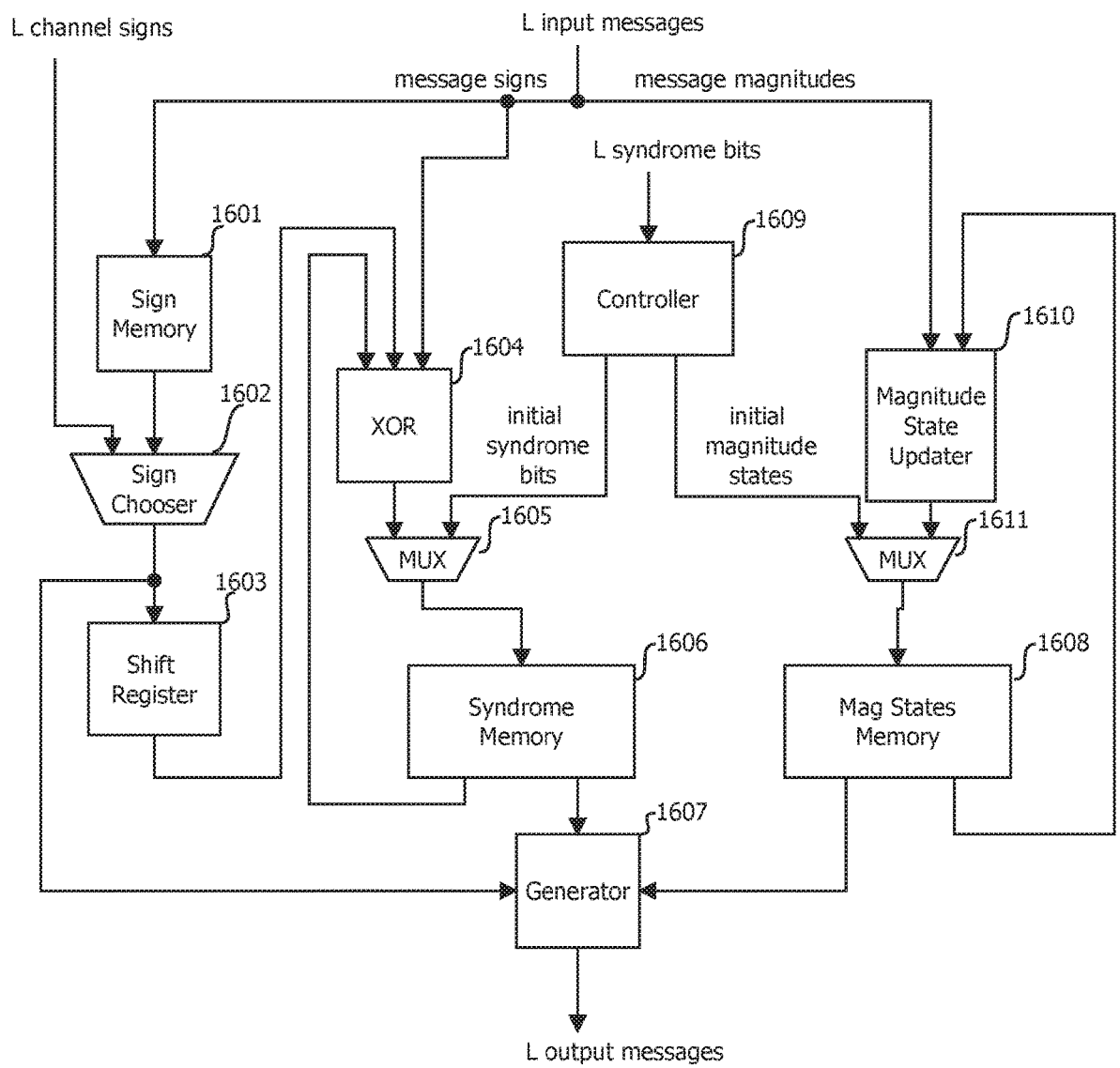
FIG. 16 shows another architecture of the check node processor used in the decoding loop module for the SCGVL and SSVL decoders, which makes use of 3-port memories, according to an embodiment.

In another preferred embodiment of the CNP, a single three-port memory 1606 (one-write, two-read memory) is used in place of the two memory blocks which are the updater syndrome memory 1506 and generator syndrome memory 1507, as shown in FIG. 16 by way of example for the case when the inputs to the decoding loop module comprise the channel values. Similarly, a single three-port memory 1608 (one-write two-read memory) is used in place of the two memory blocks Updater Mag States Memory 1513 and Generator Mag States Memory 1512 as shown in FIG. 16 by way of example for the case when the inputs to the decoding loop module comprise the channel values. The rest of the units are identical to the ones in FIG. 15.

Figure 17:
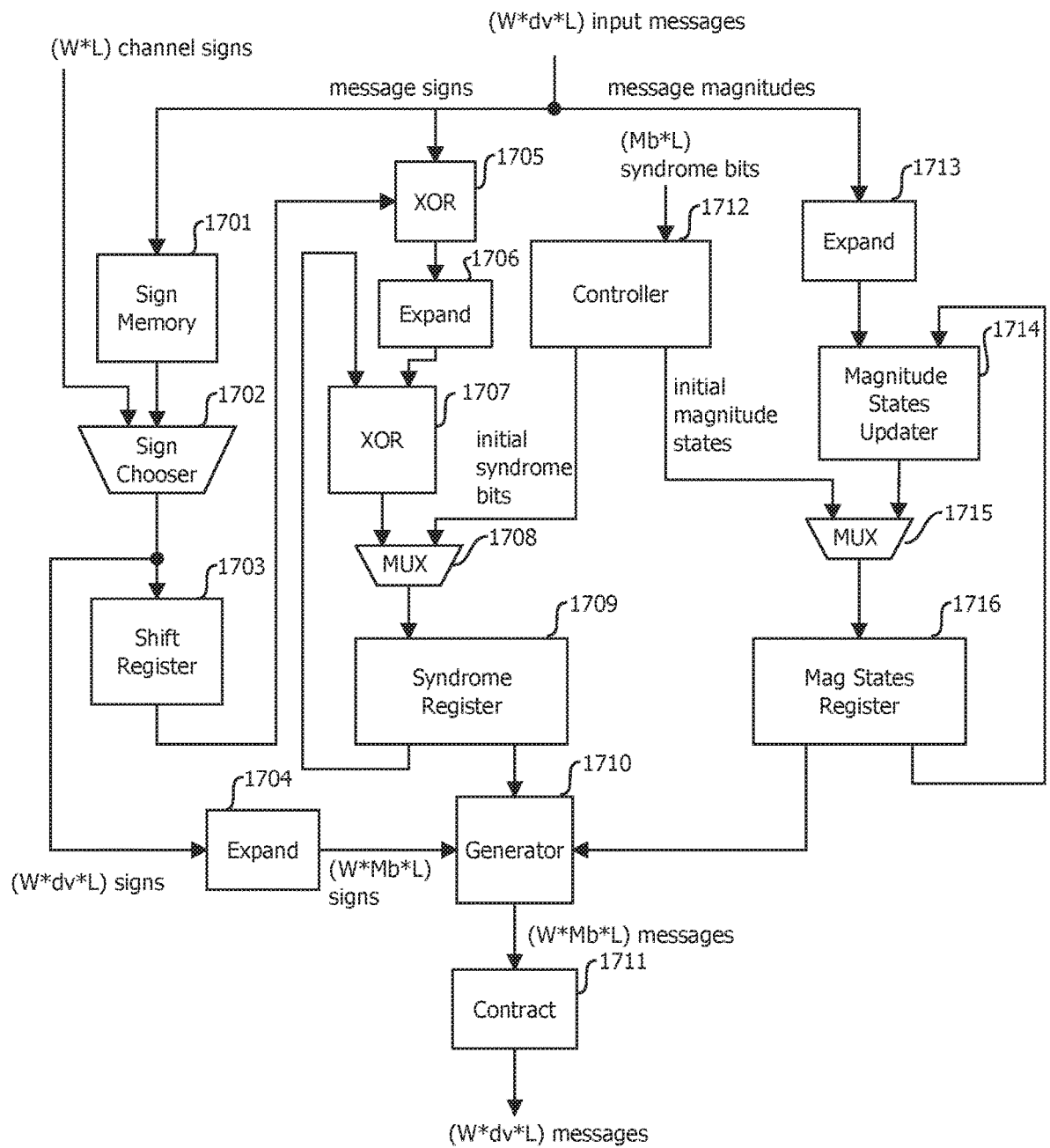
FIG. 17 shows an architecture of the check node processor used in the decoding loop module for the MCVL decoder, according to an embodiment.

A preferred embodiment of the CNP 1020 used as part of the decoding loop module 304 in the apparatus of this invention for the MCVL decoder is shown in FIG. 17 by way of example for the case when the inputs to the decoding loop module comprise the channel values. The architecture is similar to the SCGVL/SSVL decoders of FIG. 15, except that the module accepts $W*d_v*L$ input messages, $W*L$ channel signs, and $M_b*L$ syndrome bits. The functionality of the different units in FIG. 17, except the Expand (1704, 1706, 1713) and Contract 1711 units, is the same as for the SCGVL/SSVL decoders, as described in reference to FIG. 15.

The Expand units take each one of the W groups of $d_v*L$ data and place them in length $M_b*L$ registers, at the locations of the rows corresponding to the $d_v$ CPMs being processed in the current column block. For the Expand unit 1704 the data input comprises channel signs or message signs, for 1706 the data input comprises changes in message signs, and for 1706 the data input comprises message magnitudes. The Contract unit 1711 implements the inverse operation as the Expand units, i.e. it extracts out of each of the W registers of $M_b*L$ data, the $d_v*L$ data which correspond to the CPMs being processed in the current column block.

Figure 18:
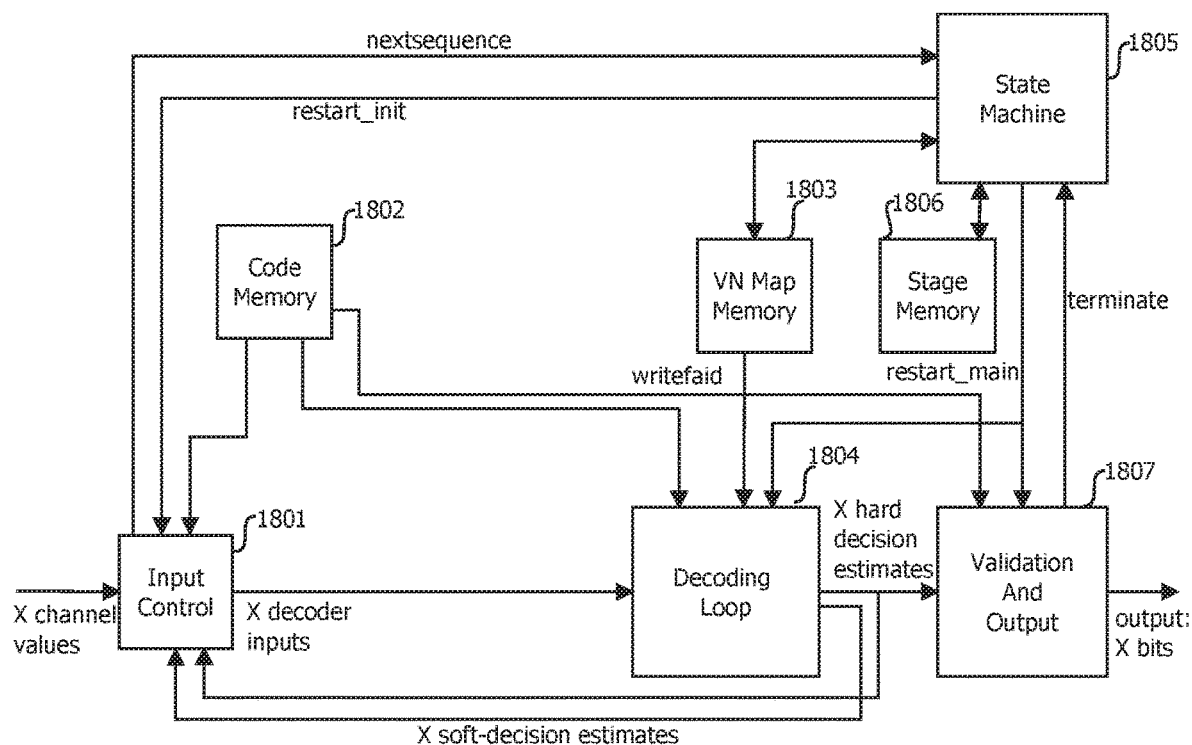
FIG. 18 shows an apparatus describing a top-level decoder architecture which does not comprise an initialization module, for the SSVL decoder, the SCVGL decoder, and the MCVL decoder, according to an embodiment.

We now describe another apparatus for the present invention. FIG. 18 illustrates another embodiment of the apparatus where the top-level decoder architecture does not comprise an initialization module. This embodiment of the apparatus may be preferred for low-throughput applications to further reduce the hardware resource usage. In this architecture as depicted in FIG. 18, the output of the input control is sent to the decoding loop module which is now responsible for initializing the decoding process. As a result, the decoding loop module and the CNP used within the decoding loop module have some differences compared to the module used in the apparatus which comprises an initialization module. However, all the remaining modules function the same as described in the previous apparatus which comprises an initialization module.

Figure 19:
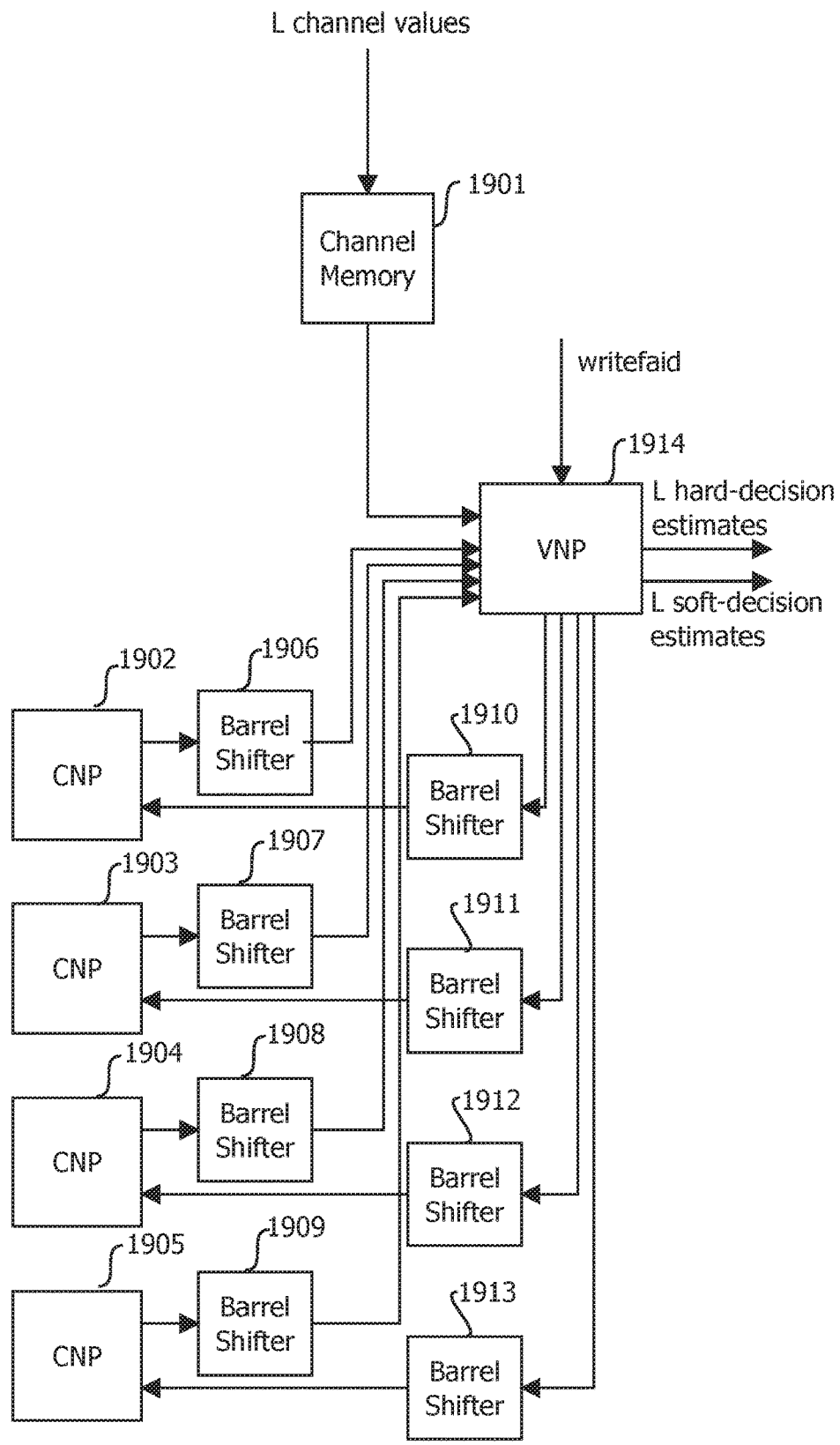
FIG. 19 shows an architecture of the decoding loop module that is used in the top-level decoder architecture which does not comprise an initialization module, for the SCVGL decoder with column block degree of $d_v=4$, according to an embodiment.

A preferred embodiment of the decoding loop module 1804 used as part of the top-level-decoder architecture in the apparatus that does not comprise an initialization module is shown in FIG. 19 for the SCVGL decoder by way of example for the case of $d_v=4$, and when the inputs to the module are the channel value. The module 1804 utilizes the first decoding iteration to perform the initialization step of the decoding process in the following manner.

As channel values arrive at the input of the decoding loop module, both their signs and magnitudes are stored in the channel memory 1901 and sent immediately to the VNP 1914. The VNP determines the initial messages to send to the CNPs (1902-1905), through the barrel shifters (1910-1913). Those initial messages are used in the CNPs to compute the initial values for the syndrome bits and the magnitude states. The CNPs do not begin to send messages back to the VNP until they have received messages from every variable node, that is until the syndrome bits for the whole processed codeword has been calculated. Once the syndrome computation is complete using all the channel values and available for us at the CNPs, and the initial magnitude states have also been computed, the CNPs then send their output messages to the VNP through the barrel shifters (1906-1909), and the processing in the module continues iteratively between the VNP and the CNPs in a manner similar to the decoding loop module 304 as described in reference to FIG. 10. The modifications presented for the decoding loop module in the case of the SCVGL decoder also apply in a similar manner to the MCVL and SSVL decoders.

Figure 20:
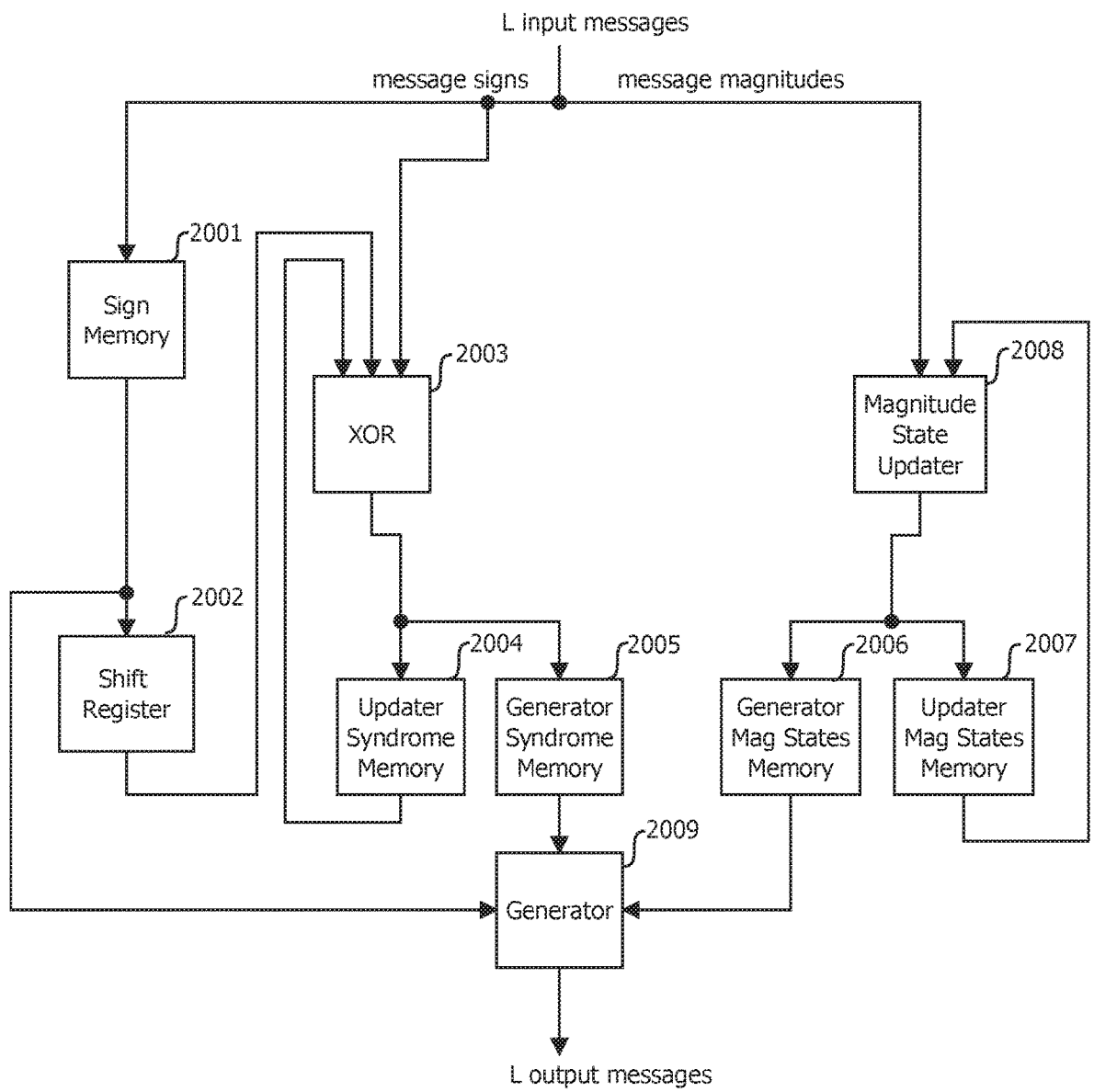
FIG. 20 shows an architecture of the check node processor used in the decoding loop module of the top-level decoder architecture which does not comprise an initialization module, for the SCVGL decoder, SCGVL decoder, and SSVL decoder, according to an embodiment.

A preferred embodiment of the CNP units (1902-1905) used in the decoding loop module 1804 of the apparatus that does not comprise an initialization module is shown in FIG. 20 by way of example when the inputs to the decoding loop module 1804 are channel values, and the architecture is used for the SCVGL and the SSVL decoders. In contrast to the CNP units (1008-1011) of the previous apparatus, the CNP units in this embodiment no longer need the signs of the channel values, since the message signs sent computed during the first decoding iteration and sent from the VNP are sufficient compute the initial syndrome bits. Similarly, the CNP does not comprise a controller unit, since the syndrome bits and the magnitude states of the check nodes are computed during the first iteration in the decoding loop module. The rest of the architecture for the CNP is identical to the description of FIG. 15.

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

Some embodiments may be implemented as circuit based processes, including possible implementation on a single integrated circuit.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The description and drawings merely illustrate the principles of the invention. It will thus be appreciated that those of ordinary skill in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

It is also to be understood that the following claims are intended to cover all of the generic and specific features of the invention herein described and all statements of the scope of the invention which, as a matter of language, might be said to fall there between.

The functions of the various elements shown in the figures, including any functional blocks labeled or referred-to as "modules," "processors," "architectures," "units," "shifters," "controllers," "registers," and "update maps," may be provided through the use of dedicated hardware or circuits, as well as hardware capable of executing software in association with appropriate software. Moreover, explicit use of these terms should not be construed to refer exclusively to hardware capable of executing software, and may implicitly include, without limitation, digital signal processor (DSP) hardware, application specific integrated circuit (ASIC), field programmable gate array (FPGA), read only memory (ROM) for storing software, random access memory (RAM), and nonvolatile storage. Other hardware, conventional and/or custom, may also be included. Such hardware can be physically implemented in semiconductor technologies such as Silicon, Germanium or Gallium based technologies, photonics technologies, as well as in emerging technologies such as chemical, biological or quantum technologies.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, schematics, pseudo code, and the like represent various processes which may be substantially represented in computer readable medium and so executed by a computer or processor, whether or not such computer or processor is explicitly shown.

What is claimed is:

1. A method for vertical layered finite alphabet iterative decoding of low-density parity-check (LDPC) codes, the method comprising:
receiving, as a first set of inputs, channel values belonging to a channel output alphabet;
using the first set of inputs for initializing, iteratively decoding and validating on one or more sub-matrices of a parity-check matrix constituting a plurality of decoding blocks, the initializing, decoding and validating performed on the plurality of decoding blocks in arbitrary order and sequentially from one decoding block to another decoding block either within a column block or across one or more column blocks;
computing, during the initializing, syndrome bits based on the first set of inputs, the syndrome bits initializing check nodes associated with the one or more sub-matrices in the plurality of decoding blocks;
iteratively processing, during a decoding loop and using the syndrome bits computed during the initializing as inputs, the one or more sub-matrices of the parity-check matrix constituting the plurality of decoding blocks, wherein the iterative processing includes:
computing, updating, and passing messages belonging to a finite alphabet, wherein the messages are iteratively passed between variable nodes and the check nodes associated with the one or more sub-matrices in the decoding blocks;
using a plurality of variable node update functions to compute outgoing messages of the variable nodes, wherein the said variable node update functions are the same from one decoding block to the next decoding block or are dynamically switched to different variable node update functions from one decoding block to the next decoding block;
using one or more check node update functions to compute outgoing messages of the check nodes; and
computing hard-decision estimates at the variable nodes based on the outgoing messages of the check nodes;
computing the syndrome bits from the hard-decision estimates during validating to check whether the hard-decision estimates constitute a codeword;
outputting the codeword, in accordance with the hard-decision estimates constituting a codeword; and
transmitting the codeword by one or more communication or storage systems.

2. The method of claim 1, further comprising a first variable node update function, a set of second variable node update functions, and a set of third variable node update functions, wherein, the processing in the decoding loop:
starts with using the first variable node update function to compute the outgoing messages of the variable nodes;
dynamically switches to using a variable node update function from the set of second variable node update functions to compute the outgoing messages of the variable nodes, when the number of unsatisfied check nodes is below a predetermined threshold; and
dynamically switches to using a variable node update function from the set of third variable node update functions to compute the outgoing messages of the variable nodes, when the number of unsatisfied check nodes is above a predetermined threshold and a predetermined number of decoding iterations have been completed.

3. The method of claim 1, further comprising a first variable node update function, a set of second variable node update functions, and a set of third variable node update functions, wherein the processing in the decoding loop which started with using the first variable node update function:
is using a variable node update function from the set of second variable node update functions to compute the outgoing messages of the variable nodes; and
dynamically switches to using a different variable node update function from the set of second variable node update functions to compute the outgoing messages of the variable nodes, when the number of unsatisfied check nodes is below a predetermined threshold and a predetermined number of decoding iterations have been completed.

4. The method of claim 1, further comprising a first variable node update function, a set of second variable node update functions, and a set of third variable node update functions, wherein the processing in the decoding loop which started with using the first variable node update function:
is using a variable node update function from the set of third variable node update functions to compute the outgoing messages of the variable nodes;
dynamically switches to using a variable node update function from the set of second variable node update functions to compute the outgoing messages of the variable nodes, when the number of unsatisfied check nodes is below a predetermined threshold; and
dynamically switches to using another variable node update function from the set of third variable node update functions to compute the outgoing messages of the variable nodes, when the number of unsatisfied check nodes is above a predetermined threshold and predetermined number of decoding iterations have been completed.

5. The method of claim 1, further comprising receiving channel values as inputs which constitute hard-decision inputs for hard-decision decoding.

6. The method of claim 1, further comprising receiving channel values as inputs which constitute soft-decision inputs for soft-decision decoding.

7. The method of claim 1, further comprising receiving channel values as inputs wherein, the channel values belong to a channel output alphabet that has a cardinality of 4.

8. The method of claim 1, further comprising using a plurality of decoding stages in the decoding loop, wherein estimates of bit values generated from a previous decoding stage are used as input in a current decoding stage.

9. The method of claim 1, further comprising using a plurality of decoding stages in the decoding loop, and using one or more different variable node update functions to compute the outgoing messages from a variable node in each decoding stage.

10. The method of claim 1, further comprising using a check node update function for each check node that computes magnitudes of the outgoing messages of the check node by only using the lowest two magnitudes of incoming messages along with their corresponding edge indices.

11. The method of claim 1, further comprising passing 3-bit messages iteratively between the variable nodes and the check nodes associated with at least one of the decoding blocks.

12. The method of claim 1, for single sub-matrix vertical layered decoding, wherein the initializing, decoding and validating is performed on a single non-null sub-matrix constituting a decoding block.

13. The method of claim 1, wherein the initializing includes computing the syndrome bits from a second set of channel values as the inputs, while the decoding loop is computing the hard-decision estimates from the first set of channel values as the inputs.

14. The method of claim 1, for multi-column vertical layered decoding, wherein the initializing, decoding and validating is performed on a group of one or more column blocks of the parity-check matrix constituting a decoding block.

* * * * *